(12) United States Patent
Lee et al.

(10) Patent No.: US 9,230,876 B2
(45) Date of Patent: Jan. 5, 2016

(54) STACK TYPE SEMICONDUCTOR PACKAGE

(71) Applicant: SAMSUNG ELECTRONICS CO., LTD., Suwon-si (KR)

(72) Inventors: Jang-Woo Lee, Cheonan-si (KR); Jong-Bo Shim, Asan-si (KR); Kyoung-sei Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/267,259

(22) Filed: May 1, 2014

(65) Prior Publication Data

US 2014/0374902 A1  Dec. 25, 2014

(30) Foreign Application Priority Data

Jun. 19, 2013  (KR) .......................... 10-2013-0070474

(51) Int. Cl.
*H01L 23/48* (2006.01)
*H01L 23/36* (2006.01)
(Continued)

(52) U.S. Cl.
CPC ............ *H01L 23/36* (2013.01); *H01L 23/5389* (2013.01); *H01L 24/03* (2013.01); *H01L 24/05* (2013.01); *H01L 24/17* (2013.01); *H01L 25/105* (2013.01); *H01L 25/50* (2013.01); *H01L 23/367* (2013.01); *H01L 23/3736* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/0346* (2013.01); *H01L 2224/03312* (2013.01); *H01L 2224/0401* (2013.01); *H01L 2224/04042* (2013.01); *H01L 2224/04105* (2013.01); *H01L 2224/05552* (2013.01); *H01L 2224/05553* (2013.01); *H01L 2224/05554* (2013.01); *H01L 2224/05555* (2013.01); *H01L 2224/05573* (2013.01); (Continued)

(58) Field of Classification Search
CPC ......... H01L 24/14; H01L 23/36; H01L 24/81; H01L 23/3128
USPC ................................................. 257/738, 777
See application file for complete search history.

(56) References Cited

U.S. PATENT DOCUMENTS 6,756,684 B2 *  6/2004  Huang ........................... 257/778
2004/0080036 A1 *  4/2004  Chang et al. ................... 257/686
(Continued)

FOREIGN PATENT DOCUMENTS

KR  10-2007-0076084  *  7/2007  .............. H01L 23/12
KR  10-2007-0076084 A   7/2007

*Primary Examiner* — Khiem D Nguyen
(74) *Attorney, Agent, or Firm* — Sughrue Mion, PLLC

(57) ABSTRACT

A stack type semiconductor package includes: a lower semiconductor package including a lower package substrate, and a lower semiconductor chip which is mounted on the lower package substrate and includes a first surface facing a top surface of the lower package substrate and a second surface opposite to the first surface; an upper semiconductor package including an upper package substrate and an upper semiconductor chip which is mounted on the upper package substrate; an inter-package connection unit which connects the lower package substrate and the upper package substrate; a heat dissipation member which is formed on the second surface of the lower semiconductor chip; and an interconnection unit which is formed on a bottom surface of the upper package substrate, and is adhered to the heat dissipation member to connect the lower semiconductor chip and the upper package substrate.

9 Claims, 25 Drawing Sheets

(51) Int. Cl.
- H01L 23/00 (2006.01)
- H01L 25/10 (2006.01)
- H01L 25/00 (2006.01)
- H01L 23/538 (2006.01)
- H01L 23/367 (2006.01)
- H01L 23/373 (2006.01)

(52) U.S. Cl.
CPC ........... *H01L 2224/05578* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/131* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/16225* (2013.01); *H01L 2224/1703* (2013.01); *H01L 2224/17181* (2013.01); *H01L 2224/17519* (2013.01); *H01L 2224/32225* (2013.01); *H01L 2224/45139* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81191* (2013.01); *H01L 2224/81192* (2013.01); *H01L 2224/94* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/18161* (2013.01)

(56) References Cited

U.S. PATENT DOCUMENTS

| | | | |
|---|---|---|---|
| 2007/0114677 A1* | 5/2007 | Kwon et al. | 257/796 |
| 2008/0290502 A1* | 11/2008 | Kutlu | 257/713 |
| 2011/0149493 A1 | 6/2011 | Kwon et al. | |
| 2011/0304035 A1 | 12/2011 | Kim et al. | |

* cited by examiner

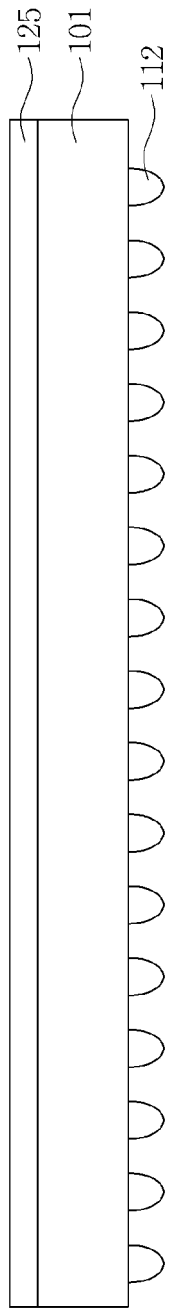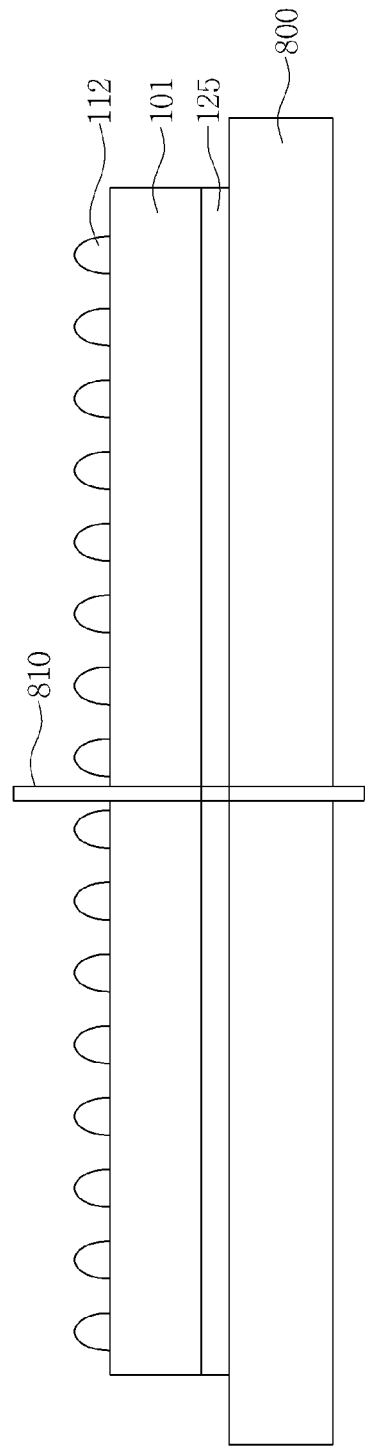
FIG. 14A
FIG. 14B

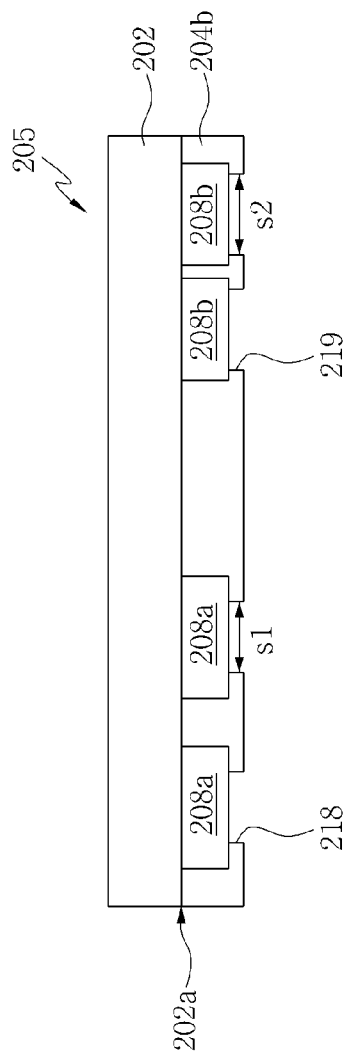
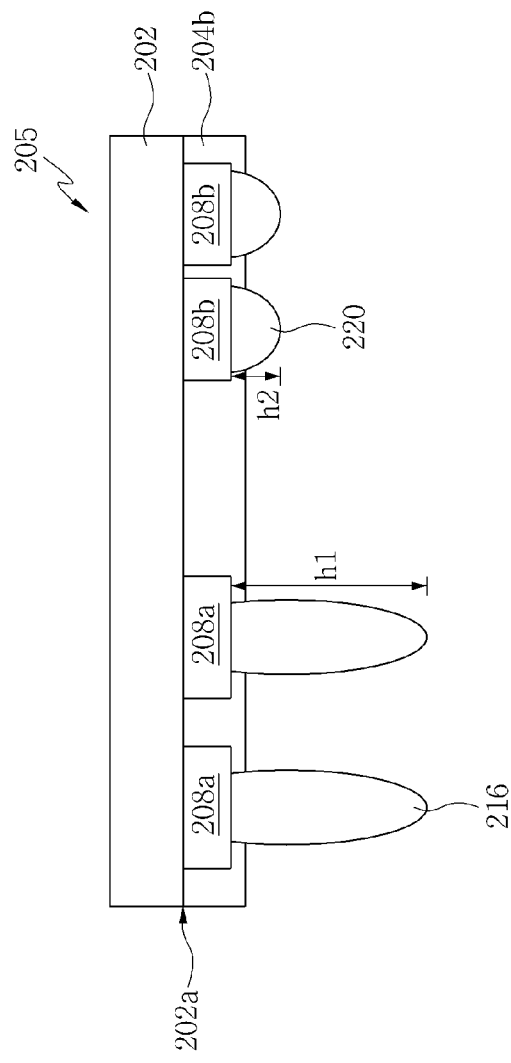

STACK TYPE SEMICONDUCTOR PACKAGE

CROSS-REFERENCE TO RELATED APPLICATION

This application claims priority from Korean Patent Application No. 10-2013-0070474 filed on Jun. 19, 2013, the disclosure of which is hereby incorporated by reference in its entirety.

BACKGROUND

1. Field

Exemplary embodiments relate to a stack type semiconductor package, a method of manufacturing the same, and a semiconductor module, an electronic circuit board, and an electronic system including the stack type semiconductor package.

2. Description of Related Art

A structure of stacking packages has been suggested in order to increase the degree of integration of a semiconductor device and miniaturize an electronic circuit system.

SUMMARY

Exemplary embodiments provide a stack type semiconductor package having high heat dissipation efficiency.

The technical objectives of the exemplary embodiments are not limited to the above disclosure. Other objectives may become apparent to those of ordinary skill in the art based on the following descriptions.

In accordance with an aspect of the exemplary embodiments, a stack type semiconductor package includes: a lower semiconductor package including a lower package substrate, and a lower semiconductor chip which is mounted on the lower package substrate and includes a first surface facing a top surface of the lower package substrate and a second surface opposite to the first surface; an upper semiconductor package including an upper package substrate and an upper semiconductor chip which is mounted on the upper package substrate; an inter-package connection unit which connects the lower package substrate and the upper package substrate; a heat dissipation member which is formed on the second surface of the lower semiconductor chip; and an interconnection unit which is formed on a bottom surface of the upper package substrate, and is adhered to the heat dissipation member to connect the lower semiconductor chip and the upper package substrate, wherein heat generated in the lower semiconductor chip is transferred through the heat dissipation member and the interconnection unit to the upper semiconductor package.

The interconnection unit may include a solder ball.

The interconnection unit may be formed on a portion of the bottom surface of the upper package substrate corresponding to the lower semiconductor chip.

The heat dissipation member may include a metal layer fully plated on the second surface of the lower semiconductor chip.

The interconnection unit may include a plurality of solder balls, and the heat dissipation member may include a plurality of metal patterns which are formed using an inkjet printing method, wherein the plurality of metal patterns are formed to respectively correspond to the plurality of solder balls.

The stack type semiconductor package may further include a lower molding material which is formed on the lower package substrate and surrounds a side surface of the lower semiconductor chip.

The heat dissipation member may be formed to extend toward a portion of a top surface of the lower molding material so as to not contact the inter-package connection unit.

The interconnection unit may include a first interconnection unit which corresponds to a portion of the heat dissipation member formed on the lower semiconductor chip, and a second interconnection unit which corresponds to a portion of the heat dissipation member formed to extend to the portion of the top surface of the lower molding material.

The stack type semiconductor package may further include: a plurality of first upper lands which are formed on a top surface of the upper package substrate to be insulated from one another by a first solder resist layer, and which the upper semiconductor chip is connected; and a plurality of second upper lands and a plurality of third upper lands which are formed on the bottom surface of the upper package substrate, the second upper lands are insulated from the third upper lands by a second solder resist layer, and which the inter-package connection unit and the interconnection unit are respectively connected, wherein the third upper lands are not electrically connected to the first upper lands and the second upper lands, and the second upper lands and the third upper lands have different exposure sizes.

The inter-package connection unit may include a lower connection unit which is formed on the lower package substrate and an upper connection unit which is formed on the second upper lands of the upper package substrate, wherein the upper connection unit and the interconnection unit have different heights.

In accordance with another aspect of the exemplary embodiments, a stack type semiconductor package includes: a lower semiconductor package including a lower package substrate, and a lower semiconductor chip which is mounted on the lower package substrate and includes a first surface facing a top surface of the lower package substrate and a second surface opposite to the first surface; an upper semiconductor package including an upper package substrate and an upper semiconductor chip which is mounted on the upper package substrate; an inter-package connection unit which electrically connects the lower semiconductor package and the upper semiconductor package; a heat dissipation member which is formed on a top surface of the lower semiconductor package so as not contact the inter-package connection unit; and a plurality of interconnection units which are formed on a bottom surface of the upper package substrate so as not contact the inter-package connection unit, and are adhered to the heat dissipation member to connect the lower semiconductor package and the upper semiconductor package, wherein heat generated in the lower semiconductor package is transferred through the heat dissipation member and the plurality of interconnection units to the upper semiconductor package.

The heat dissipation member may be formed on the second surface of the lower semiconductor chip.

The plurality of interconnection units may be formed on a portion of the bottom surface of the upper package substrate corresponding to the lower semiconductor chip.

The heat dissipation member may include a plated metal layer.

The heat dissipation member may include a plurality of metal patterns which are formed using an inkjet printing method, wherein the plurality of metal patterns are formed to respectively correspond to the plurality of interconnection units.

In accordance with yet another aspect of the exemplary embodiments, a stack type semiconductor package includes: a lower semiconductor package including a lower semiconductor chip; an upper semiconductor package including an upper semiconductor chip and disposed above the lower semiconductor package; a heat dissipation member which is formed on the lower semiconductor chip; and an interconnection unit comprising a plurality of solder balls disposed between the lower semiconductor package and the upper semiconductor package to connect the lower semiconductor chip to the upper semiconductor package.

Details of other embodiments are included in the detailed description and the drawings.

BRIEF DESCRIPTION OF THE DRAWINGS

The foregoing and other features and advantages of the exemplary embodiments will be apparent from the description of preferred embodiments, as illustrated in the accompanying drawings in which like reference characters refer to the same parts throughout the different views. The drawings are not necessarily to scale, and emphasis is placed upon illustrating the principles of the exemplary embodiments. In the drawings:

FIGS. 14A through 14D are cross-sectional views for describing a method of manufacturing a stack type semiconductor package, according to an embodiment;

FIGS. 15A and 15B are enlarged views illustrating a portion B of FIG. 14D;

DETAILED DESCRIPTION OF THE EXEMPLARY EMBODIMENTS

Figure 1:
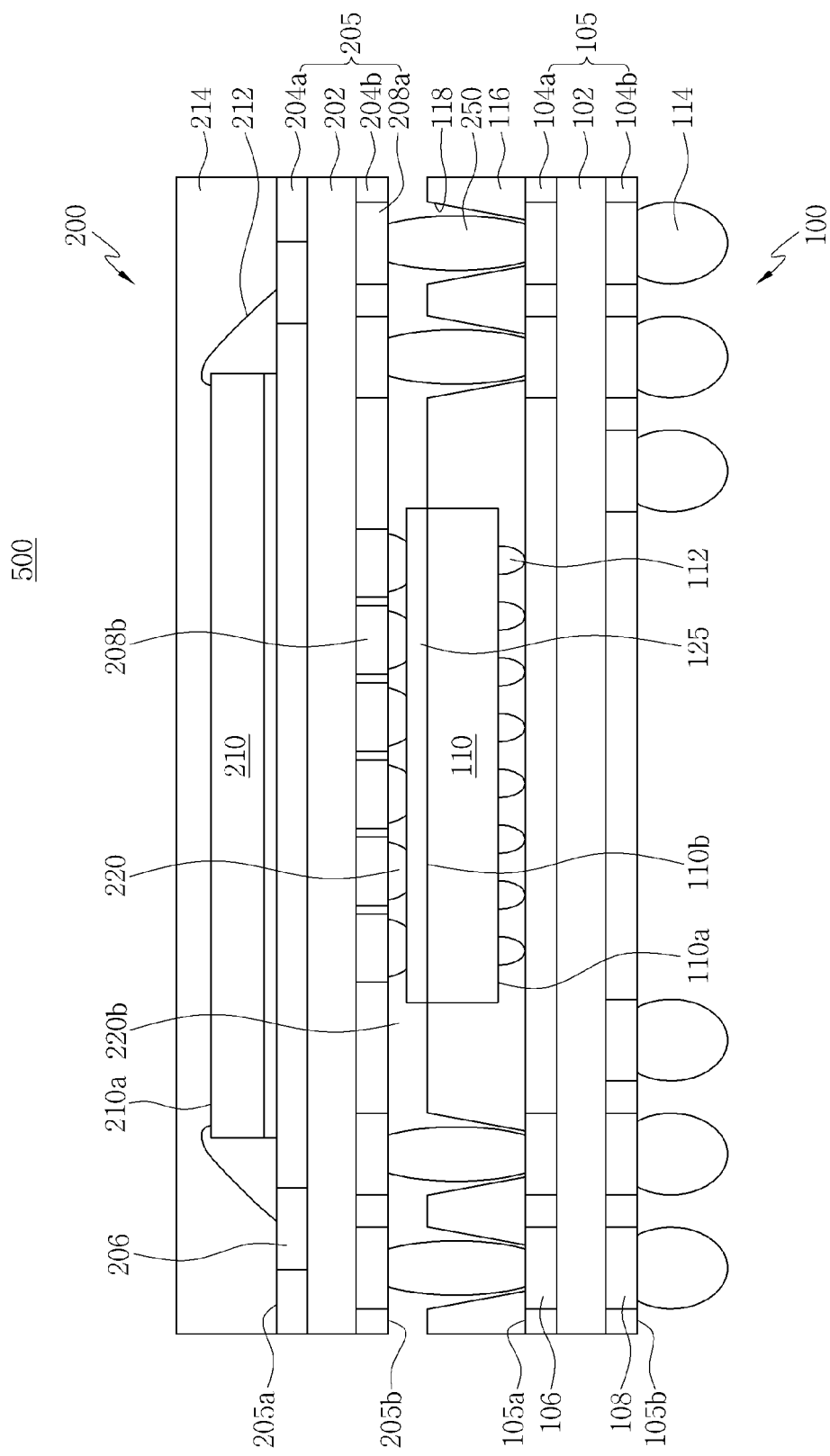
FIG. 1 is a cross-sectional view illustrating a stack type semiconductor package according to an embodiment.

The advantages, features, and methods will be described more fully with reference to the accompanying drawings, in which exemplary embodiments are shown. The exemplary embodiments may be embodied in many different forms and should not be construed as being limited to the embodiments set forth herein. Rather, these embodiments are provided so that this disclosure will be thorough and complete, and will fully convey the concept to one of ordinary skill in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated elements, steps, operations, and/or devices, but do not preclude the presence or addition of one or more other elements, steps, operations, and/or devices thereof.

Like reference numerals denote like elements throughout. In the drawings, thicknesses of layers and regions are exaggerated for clarity. It will be understood that when a layer is referred to as being "on" another layer or substrate, it can be directly on the other layer or substrate, or intervening third layers may be present.

Spatially relative terms such as "upper end," "lower end," "top surface," "bottom surface," "upper", or "lower" may be used herein for ease of description to describe one element's relationship to another element as illustrated in the figures. For example, if an upper side of a figure is referred to as an upper portion and a lower side of the figure is a lower portion for convenience, the upper portion may be termed a lower portion and the lower portion may be termed an upper portion without departing from the teachings of the exemplary embodiments.

It will be understood that, although the terms first, second, etc. may be used herein to describe various elements, these elements should not be limited by these terms. These terms are only used to distinguish one element from another element. Thus, a first element could be termed a second element and a second element may be termed a first element without departing from the teachings.

Embodiments are described herein with reference to cross-sectional illustrations and/or plan illustrations that are schematic illustrations of idealized embodiments. In the drawings, thicknesses of layers and regions are exaggerated for effective description of technical features. As such, variations from the shapes of the illustrations as a result, for example, of manufacturing techniques and/or tolerances, are to be expected. Thus, embodiments should not be construed as limited to the particular shapes illustrated herein but are to include deviations in shapes that result, for example, from manufacturing. For example, an etched region illustrated as a rectangle will, typically, have rounded or curved features. Thus, the regions illustrated in the figures are schematic in nature and their shapes are intended to illustrate a certain shape of a region of a device and are not intended to limit the scope.

Figure 2:
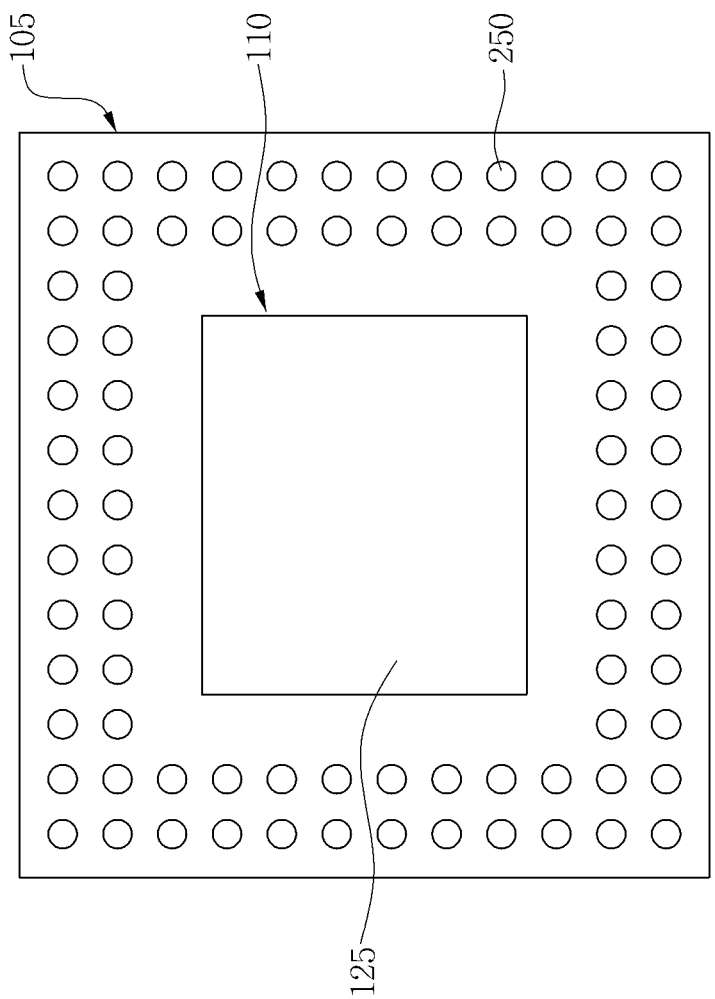
FIG. 2 is a plan view illustrating a lower package substrate of FIG. 1.

FIG. 1 is a cross-sectional view illustrating a stack type semiconductor package 500 according to an embodiment. FIG. 2 is a plan view illustrating a lower semiconductor substrate 105 of FIG. 1.

Referring to FIGS. 1 and 2, the stack type semiconductor package 500 may include a lower semiconductor package 100, an upper semiconductor package 200, an inter-package connection unit 250, a heat dissipation member 125, and an interconnection unit 220.

The stack type semiconductor package 500 may have a package-on-package (POP) structure in which the upper semiconductor package 200 is stacked on the lower semiconductor package 100. Each of the lower semiconductor package 100 and the upper semiconductor package 200 may be a package obtained after a packaging process and an electrical test are completed.

The lower semiconductor package 100 may include the lower package substrate 105, and a lower semiconductor chip 110 that is mounted on the lower package substrate 105.

Examples of the lower package substrate 105 on which a plurality of lower wiring lines are formed may include a rigid printed circuit board (PCB), a flexible PCB, and a rigid-flexible PCB. The lower package substrate 105 may include a lower core layer 102 and first and second lower solder resist layers 104a and 104b. The plurality of lower wiring lines may be formed in the lower core layer 102 constituting the lower package substrate 105. A ground voltage and a power supply voltage may be applied to the plurality of lower wiring lines.

First lower lands 106 that are insulated from one another by the first lower solder resist layer 104a may be formed on a top surface 105a of the lower package substrate 105. Second lower lands 108 that are insulated from one another by the second lower solder resist layer 104b may be formed on a bottom surface 105b of the lower package substrate 105. The first lower lands 106 may be electrically connected to the second lower lands 108 through the lower wiring lines. Each of the first and second lower lands 106 and 108 may include a metal such as copper (Cu), nickel (Ni), or gold (Au), or a solder material.

External connection members 114 for electrically connecting the stack type semiconductor package 500 to a semiconductor module board or a system board may be formed on the second lower lands 108. Each of the external connection members 114 may be formed of a solder material such as a solder ball, a solder bump, or solder paste, or a metal having a spherical shape, a mesa shape, or a pin shape. The external connection members 114 may be arranged as a grid type for embodying a ball grid array (BGA) package.

The lower semiconductor chip 110 may include a logic device such as a microprocessor, a microcontroller, or an application processor (AP). The lower semiconductor chip 110 may be a system-on-chip (SOC) that integrates various types of semiconductor devices into a single semiconductor chip.

The lower semiconductor chip 110 may be connected to the lower package substrate 105 using a flip chip method. For example, the lower semiconductor chip 110 may be a flip chip package (FCP) that is disposed such that a first surface 110a provided as an active surface on which chip pads are formed faces the top surface 105a of the lower package substrate 105 and then is directly connected to the lower package substrate 105 using conductive chip bumps 112 that are attached to the chip pads. The chip pads formed on the first surface 110a of the lower semiconductor chip 110 may be electrically connected to the first lower lands 106 through the chip bumps 112 and the lower wiring lines. Each of the chip bumps 112 may include a solder material, or a metal such as Au, silver (Ag), platinum (Pt), aluminum (Al), Cu, or Ni. When the chip bumps 112 are solder bumps, the chip bumps 112 may maintain ball shapes due to surface tension after a solder reflow process. However, when the chip bumps 112 are metal bumps, the chip bumps 112 may be formed to have mesa shapes.

The lower semiconductor package 100 may further include a lower molding material 116 that is formed on the lower package substrate 105. The lower molding material 116 for protecting electrical connection between the lower semiconductor chip 110 and the lower package substrate 105 may be formed to surround the lower semiconductor chip 110 and the chip bumps 112. Also, the lower molding material 116 may reduce stress applied to the top surface 105a of the lower package substrate 105. A second surface 110b opposite to the first surface 110a of the lower semiconductor chip 110, i.e., a back surface of the lower semiconductor chip 110 may not be covered by the lower molding material 116. Since the lower molding material 116 exposes the second surface 110b of the lower semiconductor chip 110, a total height of the stack type semiconductor package 500 may be reduced. Also, the lower molding material 116 may be formed to surround a side surface of the inter-package connection unit 250. The lower molding material 116 may include an epoxy resin, or an epoxy mold compound (EMC). If necessary, the lower molding material 116 may be formed on a bottom surface of the lower package substrate 105 to protect the second lower solder resist layer 104b and stably support the external connection members 114.

The upper semiconductor package 200 may be vertically stacked on the lower semiconductor package 100, and may include an upper package substrate 205 and an upper semiconductor chip 210 that is mounted on the upper package substrate 205. The upper semiconductor package 200 may be a multi-chip package (MCP) on which a plurality of semiconductor chips are vertically stacked. Alternatively, the upper semiconductor package 200 may have a structure in which a plurality of semiconductor chips are vertically stacked on a plurality of semiconductor chips that are horizontally arranged.

Examples of the upper package substrate 205 on which a plurality of upper wiring lines are formed may include a rigid PCB, a flexible PCB, and a rigid-flexible PCB. The upper package substrate 205 may include an upper core layer 202 and first and second upper solder resist layers 204a and 204b. The plurality of upper wiring lines may be formed in the upper core layer 202 constituting the upper package substrate 205. A ground voltage and a power supply voltage may be applied to the plurality of upper wiring lines.

First upper lands 206 that are insulated from one another by the first upper solder resist layer 204a may be formed on a top surface 205a of the upper package substrate 205. Second upper lands 208a and third upper lands 208b that are each insulated from one another by the second upper solder resist layer 204b may be formed on a bottom surface 205b of the upper package substrate 205. The first upper lands 206 may be electrically connected to the second upper lands 208a through the upper wiring lines. The third upper lands 208b are formed so as not to be electrically connected to the first and second upper lands 206 and 208a. The third upper lands 208b may be formed on a portion corresponding to the lower semiconductor chip 110. Each of the first, second, and third upper lands 206, 208a, and 208b may include a metal such as Cu, Ni, or Au, or a solder material. Only one first upper land 106 is illustrated in FIG. 1 for convenience.

The upper semiconductor chip 210 may have an active surface 210a on which chip pads are formed, and may include a memory device. The upper semiconductor chip 210 may be connected to the upper package substrate 205 using a wire bonding method or a flip chip method. For example, the chip pads formed on the active surface 210a of the upper semiconductor chip 210 may be electrically connected to the first upper lands 206 of the upper package substrate 205 through wires 212. Although the upper semiconductor chip 210 is connected to the upper package substrate 205 using a wire bonding method in FIG. 1, the upper semiconductor chip 210 may be directly connected to the upper package substrate 205 using a flip chip method.

The upper semiconductor package 200 may further include an upper molding material 214 that is formed on the upper package substrate 205 and surrounds and protects the wires 212 and the active surface 210a of the upper semiconductor chip 210. The upper molding material 214 may include an epoxy resin or an EMC.

The inter-package connection unit 250 may be disposed between the first lower lands 106 of the lower package substrate 105 and the second upper lands 208a of the upper package substrate 205, and may electrically connect the lower semiconductor package 100 and the upper semiconductor package 200. The inter-package connection unit 250 may include a lower connection unit that is formed on the first lower lands 106 of the lower package substrate 105 and an upper connection unit that is formed on the second upper lands 208a of the upper package substrate 205, through a via hole 118 that is formed in and through the lower molding material 116. The inter-package connection unit 250 may include a solder material, or a metal such as Au, Cu, or Ni.

The heat dissipation member 125 may be formed on the second surface 110b of the lower semiconductor chip 110. The heat dissipation member 125 may improve adhesion between the lower semiconductor chip 110 and the interconnection unit 220, and may dissipate heat generated during an operation of the lower semiconductor chip 110 to the outside. The heat dissipation member 125 may be formed of a metal material having high thermal conductivity, such as Cu, Ni, Al, Au, Ag, or an alloy thereof. As shown in FIG. 2, the heat dissipation member 125 may include a metal layer, e.g., a Cu layer, fully plated on the second surface 110b of the lower semiconductor chip 110. The heat dissipation member 125 may be formed to have the same area as that of the lower semiconductor chip 110.

The interconnection unit 220 may be formed on a portion of the bottom surface 205b of the upper package substrate 205 which corresponds to the lower semiconductor chip 110. The interconnection unit 220 may be formed on the third upper lands 208b of the upper package substrate 205, and may be adhered to the heat dissipation member 125 to connect the lower semiconductor chip 110 and the upper package substrate 205. The interconnection unit 220 may be formed of a solder material such as a solder ball. The upper connection unit formed on the second upper lands 208a and the interconnection unit 220 formed on the third upper lands 208b may be formed to have different heights, which will be explained below.

It is very important in ensuring high reliability of a semiconductor package to dissipate heat generated during an operation of a semiconductor chip. In the stack type semiconductor package 500, heat generated during an operation of the lower semiconductor chip 110 has to be transferred to the upper semiconductor package 200 such that the heat is dissipated to the outside air.

When the lower molding material 116 is formed to expose a back surface of the lower semiconductor chip 110, i.e., the second surface 110b, an air gap is formed between the lower semiconductor package 100 and the upper semiconductor package 200.

In a related art, material having high thermal conductivity, i.e., a high k value, is a high thermal conductor, and a material having low thermal conductivity, i.e., a low k value, is a high thermal insulator. A metal is a high thermal conductor having a high k value, whereas air is a high thermal insulator having a low k value. The air gap formed between the lower semiconductor package 100 and the upper semiconductor package 200 acts as a high thermal insulator. Thus, heat generated in the lower semiconductor chip 110 is not transferred to the upper semiconductor package 200, thereby failing to effectively dissipate the heat.

According to the stack type semiconductor package 500 of FIGS. 1 and 2, since the heat dissipation member 125 and the interconnection unit 220 are formed between the lower semiconductor package 100 and the upper semiconductor package 200, an air gap formed between the lower semiconductor chip 110 and the upper package substrate 205 may be removed, improving heat dissipation efficiency.

Heat generated in the lower semiconductor chip 110 may be transferred through the heat dissipation member 125 formed on the second surface 110b of the lower semiconductor chip 110 and the interconnection unit 220 formed on the bottom surface 205b of the upper package substrate 205 to the upper semiconductor package 200 such that the heat is dissipated to the outside air. In other words, the heat dissipation member 125 transfers heat generated during an operation of the lower semiconductor chip 110 to the interconnection unit 220 that is disposed over the heat dissipation member 125 due to thermal conduction. Since the interconnection unit 220 is formed of a solder material having high thermal conductivity, the interconnection unit 220 may improve heat dissipation characteristics. Heat generated in the lower semiconductor chip 110 may be transferred to a body and a surface of the upper semiconductor package 200 through the interconnection unit 220 and then may be smoothly dissipated to the outside air. Accordingly, heat dissipation efficiency of the stack type semiconductor package 500 may be improved and an operation error caused by overheating may be avoided due to the heat dissipation member 125 and the interconnection unit 220 formed between the lower semiconductor chip 110 and the upper package substrate 205. Thus, product reliability and durability is improved.

Stack type semiconductor packages according to various embodiments will be explained focusing on differences and omitting repetitions.

Figure 3:
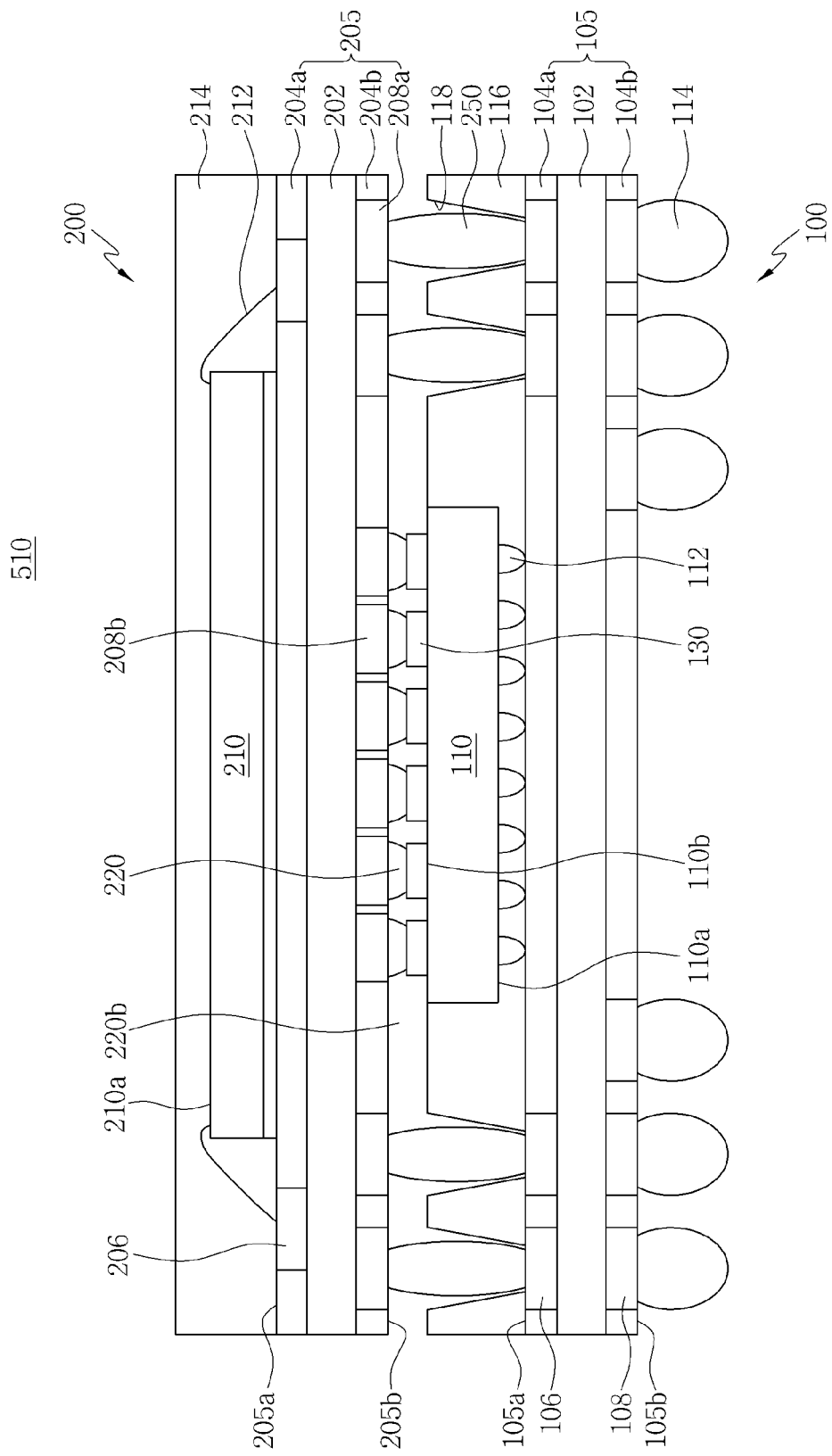
FIG. 3 is a cross-sectional view illustrating a stack type semiconductor package according to another embodiment.
Figure 4:
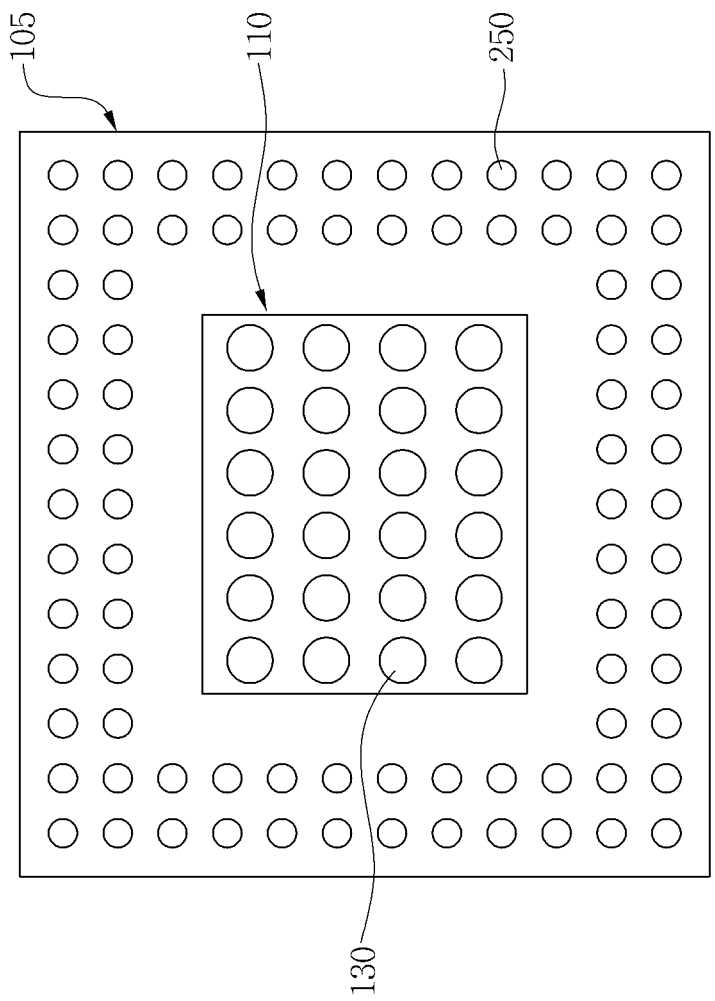
FIG. 4 is a plan view illustrating the lower package substrate of FIG. 3.

FIG. 3 is a cross-sectional view illustrating a stack type semiconductor package 510 according to another embodiment. FIG. 4 is a plan view illustrating the lower package substrate 105 of FIG. 3.

Referring to FIGS. 3 and 4, the stack type semiconductor package 510 may include the lower semiconductor package 100, the upper semiconductor package 200, the inter-package connection unit 250, a heat dissipation member 130, and the interconnection unit 220.

The lower semiconductor package 100 may include the lower package substrate 105, the lower semiconductor chip 110 that is mounted on the lower package substrate 105, and the lower molding material 116 that is formed on the lower package substrate 105 and surrounds a side surface of the lower semiconductor chip 110.

The lower package substrate 105 may include the lower core layer 102 on which a plurality of lower wiring lines are formed, and the first and second lower solder resist layers 104a and 104b. The first lower lands 106 and the second lower lands 108 may be respectively formed on the top surface 105a and the bottom surface 105b of the lower package substrate 105. The first lower lands 106 may be electrically connected to the second lower lands 108 through the lower wiring lines. The external connection members 114 for electrically connecting the stack type semiconductor package 510 to a semiconductor module board or a system board may be formed on the second lower lands 108.

The lower semiconductor chip 110 may include a logic device, and may be connected to the lower package substrate 105 using a flip chip method. Chip pads formed on an active surface, i.e., on the first surface 110a, of the lower semiconductor chip 110 may be electrically connected to the first lower lands 106 through the lower wiring lines and the chip bumps 112 that are attached to the chip pads.

The upper semiconductor package 200 may include the upper package substrate 205, the upper semiconductor chip 210 that is mounted on the upper package substrate 205, and the upper molding material 214 that is formed on the upper package substrate 205 to surround the active surface 210a of the upper semiconductor chip 210.

The upper package substrate 205 may include the upper core layer 202 on which a plurality of upper wiring lines are formed, and the first and second upper solder resist layers 204a and 204b. The first upper lands 206 that are insulated from one another by the first upper solder resist layer 204a may be formed on the top surface 205a of the upper package substrate 205. The second upper lands 208a and the third upper lands 208b that are each insulated from one another by the second upper solder resist layer 204b may be formed on the bottom surface 205b of the upper package substrate 205. The first upper lands 206 may be electrically connected to the second upper lands 208a through the upper wiring lines. The third upper lands 208b may be formed not to be electrically connected to the first and second upper lands 206 and 208a.

The upper semiconductor chip 210 may have the active surface 210a on which chip pads are formed, and may include a memory device. The upper semiconductor chip 210 may be connected to the upper package substrate 205 using a wire bonding method or a flip chip method. For example, the chip pads formed on the active surface 210a of the upper semiconductor chip 210 may be electrically connected to the first upper lands 206 of the upper package substrate 205 through the wires 212.

The inter-package connection unit 250 may be disposed between the first lower lands 106 of the lower package substrate 105 and the second upper lands 208a of the upper package substrate 205 to electrically connect the lower semiconductor package 100 and the upper semiconductor package 200. The inter-package connection unit 250 may include a lower connection unit that is formed on the first lower lands 106 of the lower package substrate 105 through the via hole 116, which is formed through the lower molding material 116, and an upper connection unit that is formed on the second upper lands 208a of the upper package substrate 205.

The heat dissipation member 130 may be formed on the second surface 110b that is opposite to the first surface 110a of the lower semiconductor chip 110. The heat dissipation member 130 may improve adhesion between the lower semiconductor chip 110 and the interconnection unit 220, and may dissipate heat generated during an operation of the lower semiconductor chip 110 to the outside. The heat dissipation member 130 may be formed of a metal material having high thermal conductivity such as Cu, Ni, Al, Au, Ag, or an alloy thereof. As shown in FIG. 4, the heat dissipation member 130 may include a plurality of metal patterns that are formed on the second surface 110b of the lower semiconductor chip 110 using an inkjet printing method. The heat dissipation member 130 may be formed to have a circular shape, a quadrangular shape, an oval shape, a cross shape, or a combination thereof.

The interconnection unit 220 may be formed on a portion of the bottom surface 205b of the upper package substrate 205 which corresponds to the lower semiconductor chip 110. The interconnection unit 220 may be formed on the third upper lands 208b of the upper package substrate 205, and may be adhered to the heat dissipation member 130 to connect the lower semiconductor chip 110 and the upper package substrate 205. The upper connection unit formed on the second upper lands 208a of the upper package substrate 205 and the interconnection unit 220 formed on the third upper lands 208b of the upper package substrate 205 may be formed to have different heights, which will be explained below.

The interconnection unit 220 may include a plurality of solder balls. The metal patterns of the heat dissipation member 130 may be formed to respectively correspond to the solder balls of the interconnection unit 220. Heat generated in the lower semiconductor chip 110 may be transferred through the heat dissipation member 130 formed on the second surface 110b of the lower semiconductor chip 110 and the interconnection unit 220 formed on the bottom surface 205b of the upper package substrate 205 to the upper semiconductor package 200 such that the heat is dissipated to the outside air.

Figure 5:
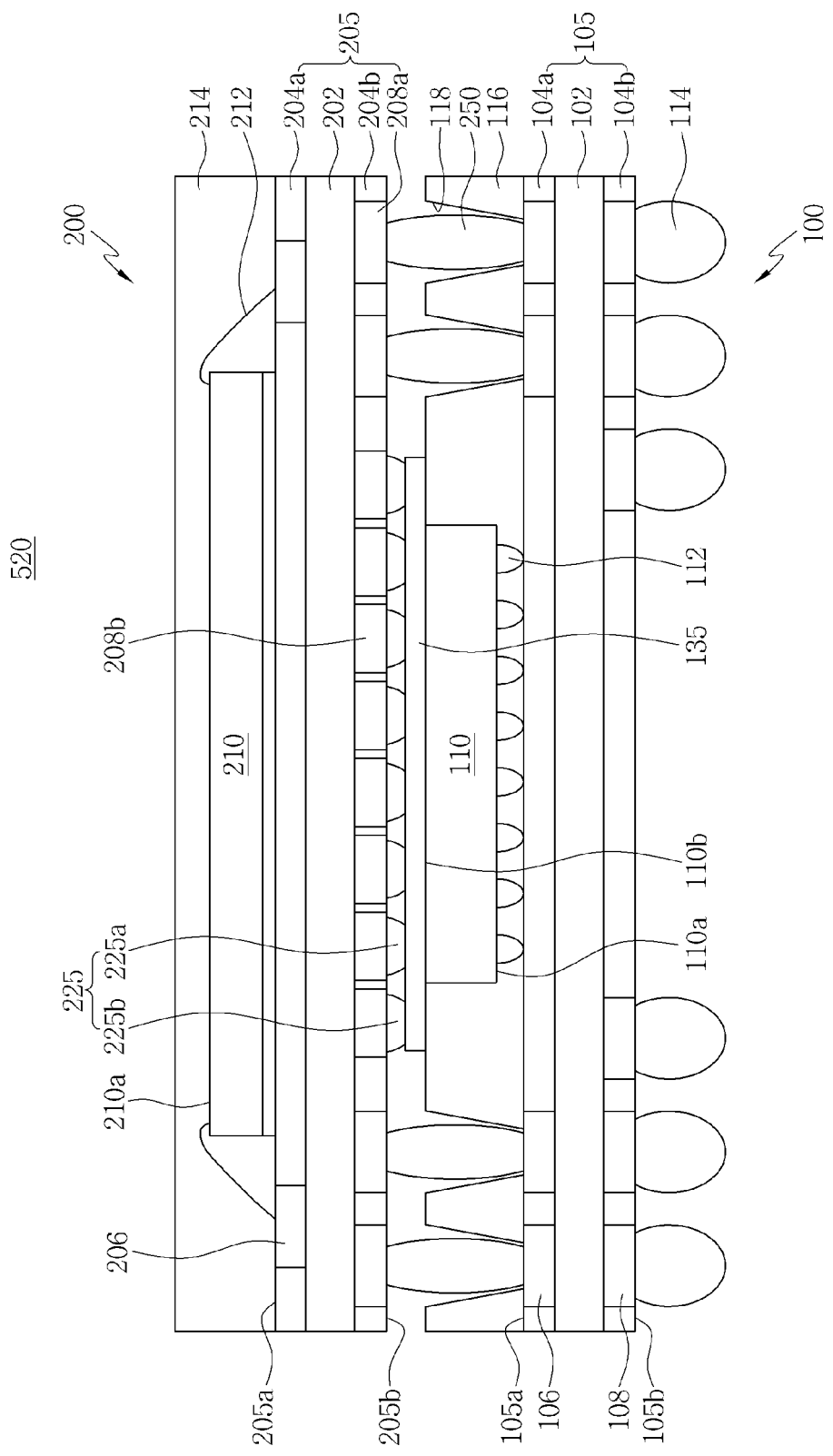
FIG. 5 is a cross-sectional view illustrating a stack type semiconductor package according to another embodiment.
Figure 6:
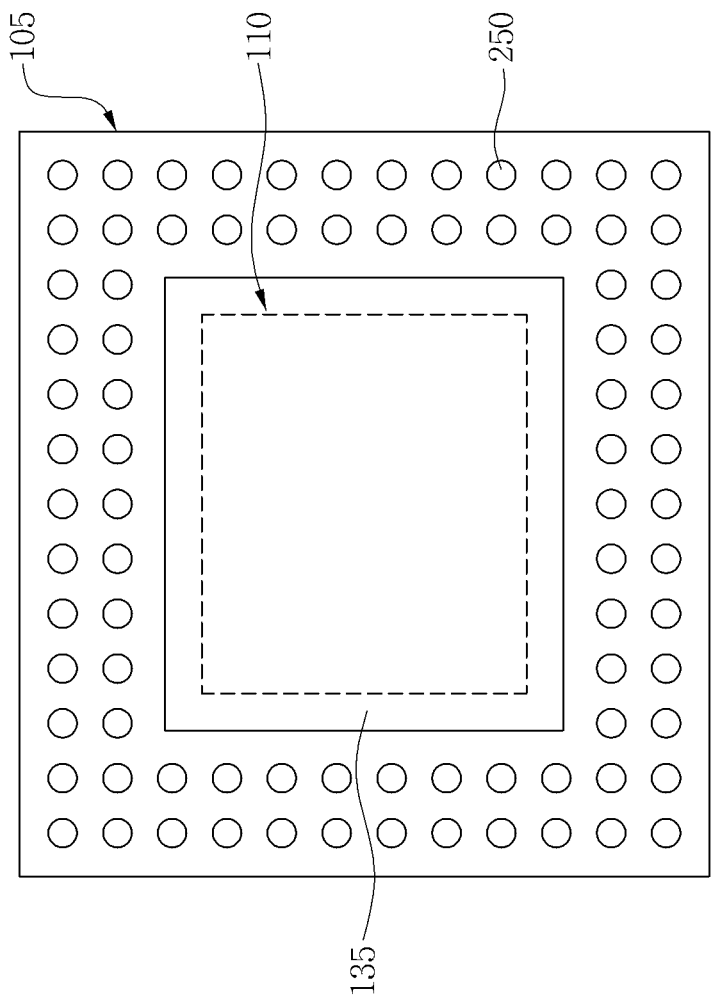
FIG. 6 is a plan view illustrating the lower package substrate of FIG. 5.

FIG. 5 is a cross-sectional view illustrating a stack type semiconductor package 520 according to another embodiment. FIG. 6 is a plan view illustrating the lower package substrate 105 of FIG. 5.

Referring to FIGS. 5 and 6, the stack type semiconductor package 520 may include the lower semiconductor package 100, the upper semiconductor package 200, the inter-package connection unit 250 that electrically connects the lower semiconductor package 100 and the upper semiconductor package 200, a heat dissipation member 135, and an interconnection unit 225.

The lower semiconductor package 100 may include the lower package substrate 105, the lower semiconductor chip 110 that is mounted on the lower package substrate 105, the lower molding material 116 that is formed on the lower package substrate 105 and surrounds a side surface of the lower semiconductor chip 110, and the external connection members 114 that are formed on the bottom surface 105b of the lower package substrate 105.

Chip pads formed on the first surface 110a of the lower semiconductor chip 110 may be electrically connected to the lower package substrate 105 through lower wiring lines and the chip bumps 112 that are attached to the chip pads.

The upper semiconductor package 200 may include the upper package substrate 205, the upper semiconductor chip 210 that is mounted on the upper package substrate 205, and the upper molding material 214 that is formed on the upper package substrate 205 to cover the active surface 210a of the upper semiconductor chip 210.

The heat dissipation member 135 may be formed to extend toward a portion of a top surface of the lower molding material 116 not to contact the inter-package connection unit 250. In other words, as shown in FIG. 6, the heat dissipation member 135 may be formed on the entire second surface 110b of the lower semiconductor chip 110 and the portion of the top surface of the lower molding material 116. The heat dissipation member 135 may include a plated metal layer, for example, a plated Cu layer.

The interconnection unit 225 may be formed on the bottom surface 205b of the upper package substrate 205, and may be adhered to the heat dissipation member 135 that is disposed under the interconnection unit 225 to connect the lower semiconductor package 100 and the upper semiconductor package 200. The interconnection unit 225 may include a first interconnection unit 225a that corresponds to the lower semiconductor chip 110, and a second interconnection unit 225b that corresponds to the portion of the top surface of the lower molding material 116.

Heat generated in the lower semiconductor chip 110 and heat generated in the lower molding material 116 that surrounds the lower semiconductor chip 110 may be transferred through the heat dissipation member 135 that is formed on the second surface 110b of the lower semiconductor chip 110 and the portion of the top surface of the lower molding material 116 and the interconnection unit 225 that is formed on the bottom surface 205b of the upper package substrate 205 and is adhered to the heat dissipation member 135 to the upper semiconductor package 200 such that heat is dissipated to the outside air.

Figure 7:
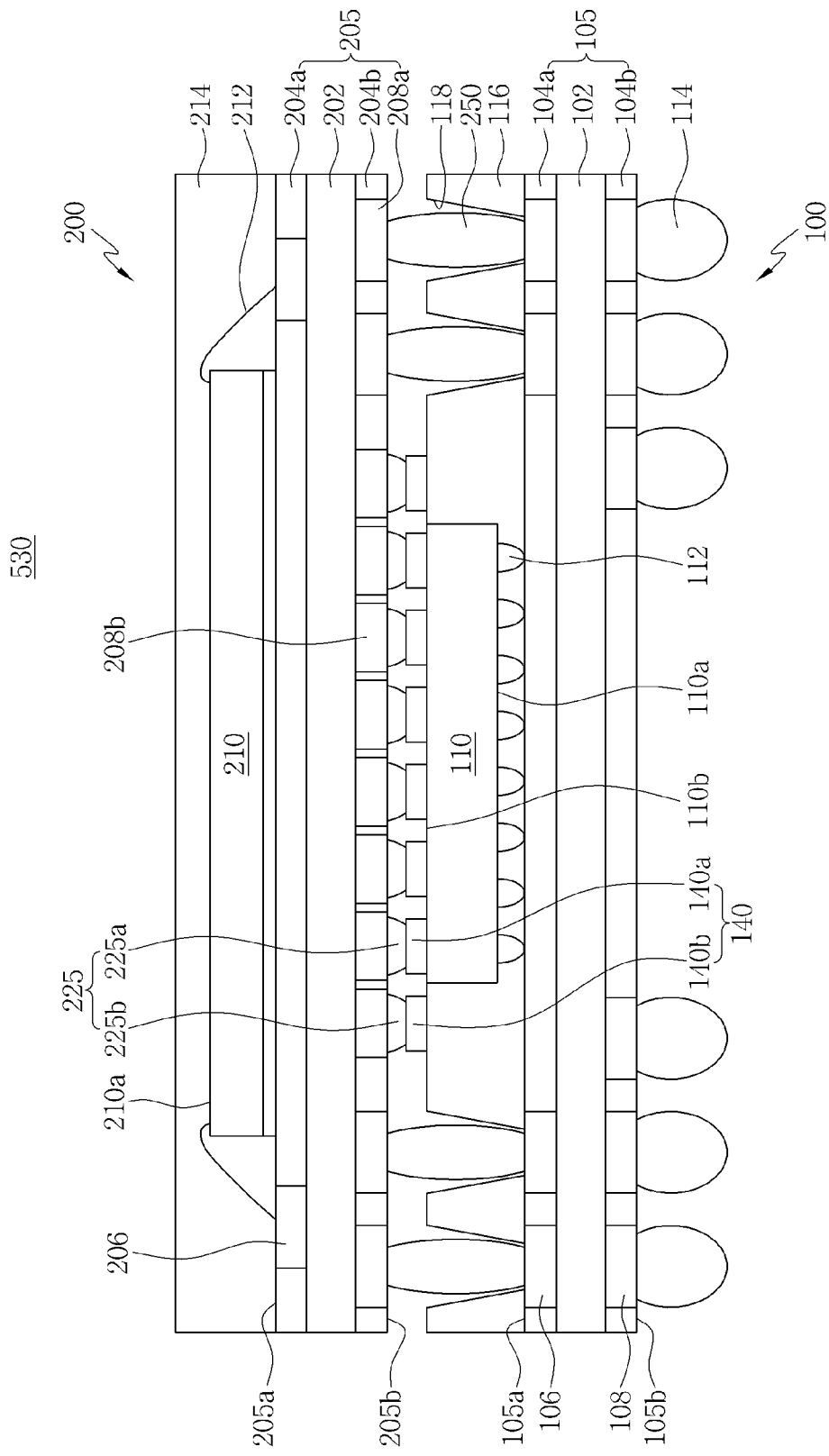
FIG. 7 is a cross-sectional view illustrating a stack type semiconductor package according to another embodiment.
Figure 8:
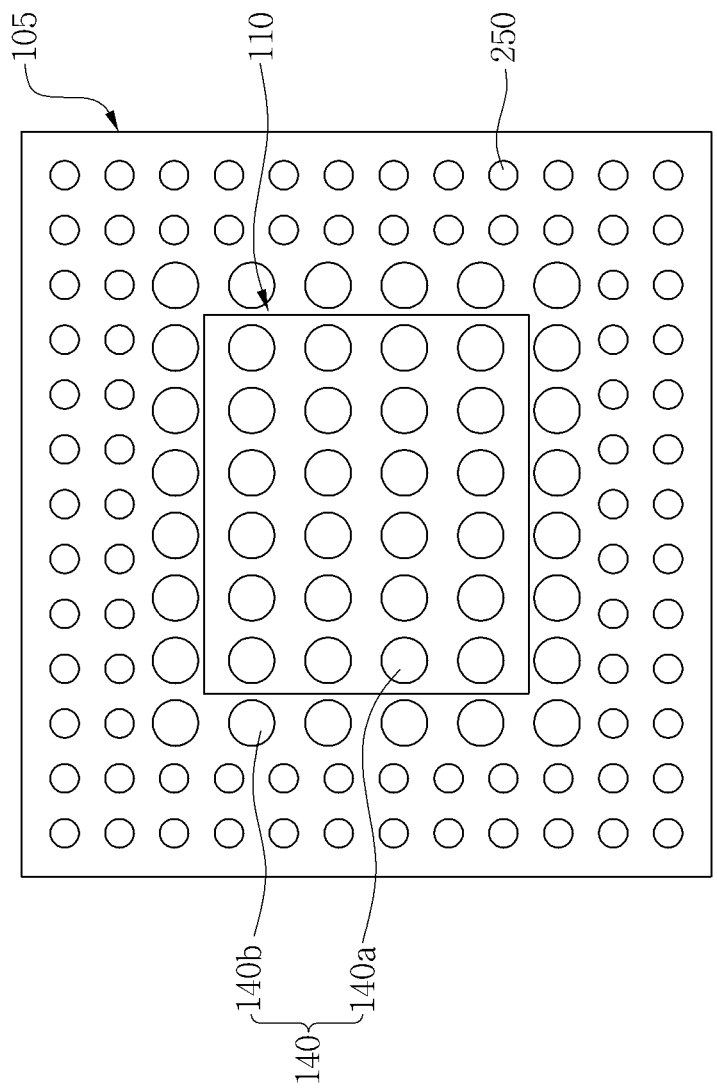
FIG. 8 is a plan view illustrating the lower package substrate of FIG. 7.

FIG. 7 is a cross-sectional view illustrating a stack type semiconductor package 530 according to another embodiment. FIG. 8 is a plan view illustrating the lower package substrate 105 of FIG. 7.

Referring to FIGS. 7 and 8, the stack type semiconductor package 530 may include the lower semiconductor package 100, the upper semiconductor package 200, the inter-package connection unit 250 that electrically connects the lower semiconductor package 100 and the upper semiconductor package 200, a heat dissipation member 140, and the interconnection unit 225.

The lower semiconductor package 100 may include the lower package substrate 105, the lower semiconductor chip 110 that is mounted on the lower package substrate 105, the lower molding material 116 that is formed on the lower package substrate 105 and surrounds a side surface of the lower semiconductor chip 110, and the external connection members 114 that are formed on the bottom surface 105b of the lower package substrate 105.

Chip pads formed on the first surface 110a of the lower semiconductor chip 110 may be electrically connected to the lower package substrate 105 through lower wiring lines and the chip bumps 112 that are attached to the chip pads.

The upper semiconductor package 200 may include the upper package substrate 205, the upper semiconductor chip 210 that is mounted on the upper package substrate 205, and the upper molding material 214 that is formed on the upper package substrate 205 to cover the active surface 210a of the upper semiconductor chip 210.

As shown in FIG. 8, the heat dissipation member 140 may include a first heat dissipation member 140a that is formed on the second surface 110b of the lower semiconductor chip 110, and a second heat dissipation member 140b that is formed on a portion of a top surface of the lower molding material 116. The second heat dissipation member 140b may be formed not to contact the inter-package connection unit 250. The heat dissipation member 140 may include a plurality of metal patterns that are formed using an inkjet printing method. The heat dissipation member 140 may be formed to have a circular shape, a quadrangular shape, an oval shape, a cross shape, or a combination thereof.

The interconnection unit 225 may be formed on the bottom surface 205b of the upper package substrate 205, and may be adhered to the heat dissipation member 140 that is disposed under the interconnection unit 225 to connect the lower semiconductor package 100 and the upper semiconductor package 200. The interconnection unit 225 may include the first interconnection unit 225a that corresponds to the first heat dissipation member 140a formed on the lower semiconductor chip 110 and the second interconnection unit 225b that corresponds to the second heat dissipation member 140b formed on the portion of the top surface of the lower molding material 116. The interconnection unit 225 may include a plurality of solder balls. The metal patterns of the heat dissipation member 140 may be formed to respectively correspond to the solder balls of the interconnection unit 225.

Heat generated in the lower semiconductor chip 110 and heat generated in the lower molding material 116 that surrounds the lower semiconductor chip 110 may be transferred through the heat dissipation member 140 and the interconnection unit 225 to the upper semiconductor package 200 such that the heat is dissipated to the outside air.

FIGS. 9 through 12 are cross-sectional views illustrating stack type semiconductor packages according to various embodiments.

Figure 9:
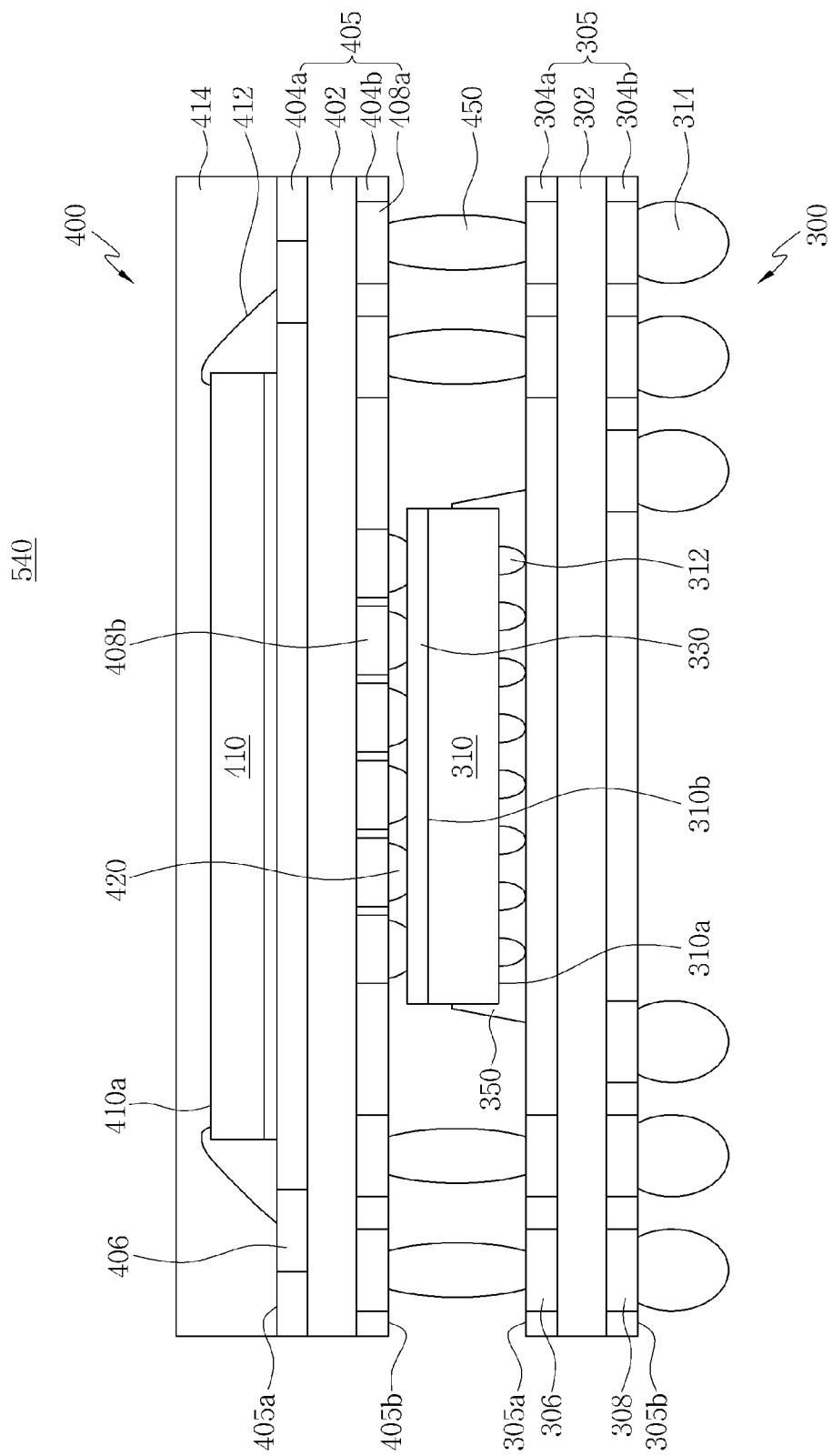
FIGS. 9 through 12 are cross-sectional views illustrating stack type semiconductor packages according to various embodiments.

Referring to FIG. 9, a stack type semiconductor package 540 according to another embodiment may include a lower semiconductor package 300 including a lower package substrate 305 and a lower semiconductor chip 310 that is mounted on the lower package substrate 305, an upper semiconductor package 400 including an upper package substrate 405 and an upper semiconductor chip 410 that is mounted on the upper package substrate 405, an inter-package connection unit 450 that electrically connects the lower semiconductor package 300 and the upper semiconductor package 400, a heat dissipation member 325, and an interconnection unit 420.

The lower semiconductor chip 310 may be a flip chip package that is disposed such that a first surface 310a on which chip pads are formed faces a top surface 305a of the lower package substrate 305 and then is directly connected to the lower package substrate 305 using conductive chip bumps 312 that are attached to the chip pads.

The lower semiconductor package 300 may further include an underfill member 350 that fills a space between the first surface 310a of the lower semiconductor chip 310 and the top surface 305a of the lower package substrate 305. The underfill member 350 may improve adhesion between the lower semiconductor chip 310 and the lower package substrate 305, improve structural/mechanical stability of the chip bumps 312, and protect a coupling state of the chip bumps 312 from an external environment. The underfill member 350 may be formed of an underfull resin such as an epoxy resin, and may include a silica filler or a plus.

The heat dissipation member 325 may be formed on a second surface 310b of the lower semiconductor chip 310. The heat dissipation member 325 may include a metal layer, e.g., a Cu layer, fully plated on the second surface 310b of the lower semiconductor chip 310. The heat dissipation member 325 may be formed to have the same area as that of the lower semiconductor chip 310.

The interconnection unit 420 may be formed on a portion of a bottom surface 405b of the upper package substrate 405 which corresponds to the lower semiconductor chip 310. The interconnection unit 420 may be adhered to the heat dissipation member 325 to connect the lower semiconductor chip 310 and the upper package substrate 405. The interconnection unit 420 may be formed of a solder material such as a solder ball.

Heat generated in the lower semiconductor chip 310 may be transferred through the heat dissipation member 325 and the interconnection unit 420 to the upper semiconductor package 400 to be dissipated to the outside air.

Figure 10:
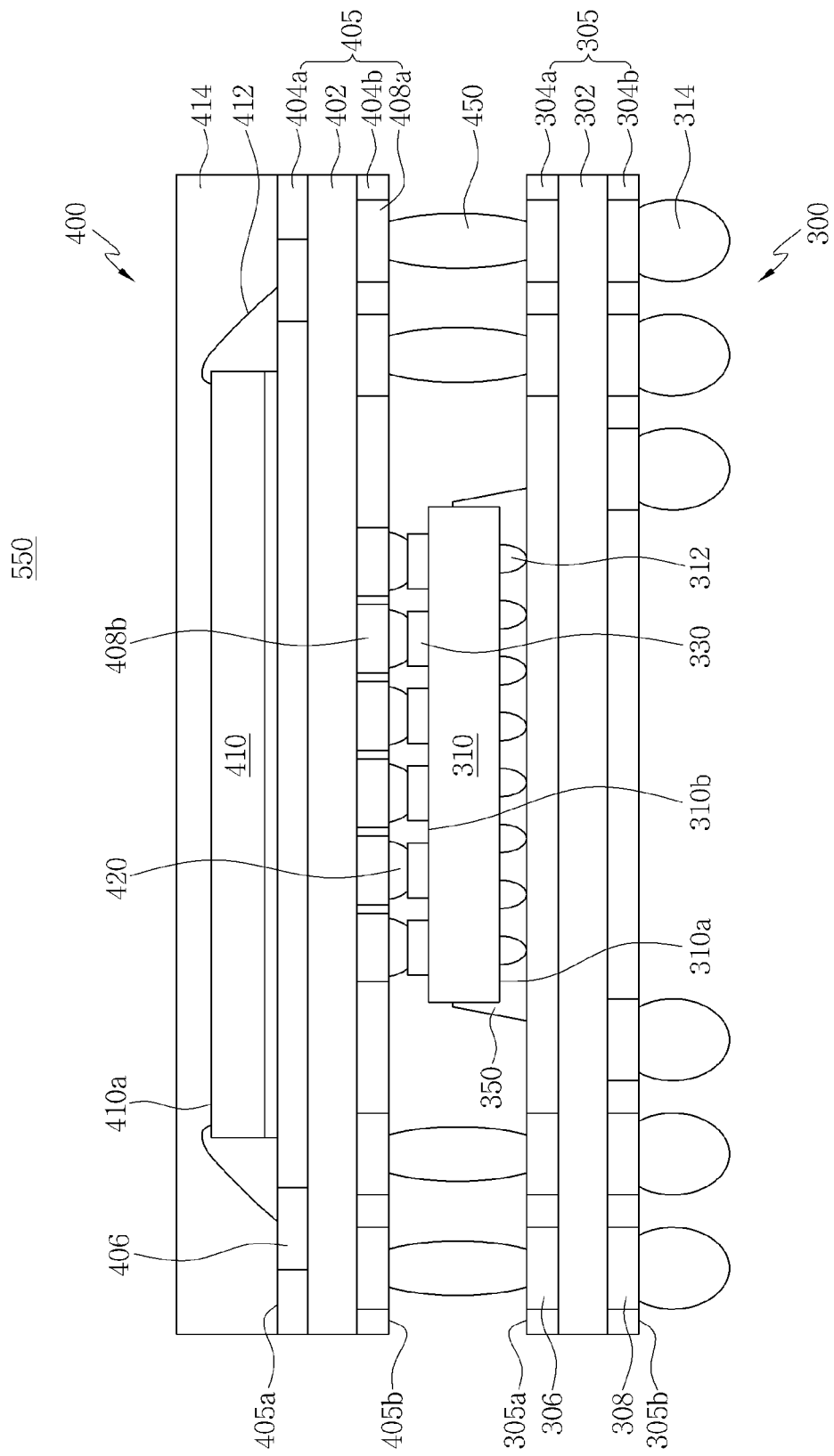

Referring to FIG. 10, a stack type semiconductor package 550 according to another embodiment may include the lower semiconductor package 300 including the lower package substrate 305 and the lower semiconductor chip 310 that is mounted on the lower package substrate 305, the upper semiconductor package 400 including the upper package substrate 405 and the upper semiconductor chip 410 that is mounted on the upper package substrate 405, the inter-package connection unit 450 that electrically connects the lower and upper semiconductor packages 300 and 400, the underfill member 350 that fills a space between the first surface 310a of the lower semiconductor chip 310 and the top surface 305a of the lower package substrate 305, a heat dissipation member 330, and the interconnection unit 420.

The heat dissipation member 330 may be formed on the second surface 310b of the lower semiconductor chip 310. The heat dissipation member 330 may include a plurality of metal patterns that are formed on the second surface 310b of the lower semiconductor chip 310 using an inkjet printing method.

The interconnection unit 420 may include a plurality of solder balls. The metal patterns of the heat dissipation member 330 may be formed to respectively correspond to the solder balls of the interconnection unit 420.

Heat generated in the lower semiconductor chip 310 may be transferred through the heat dissipation member 330 and the interconnection unit 420 to the upper semiconductor package 400 to be dissipated to the outside air.

Figure 11:
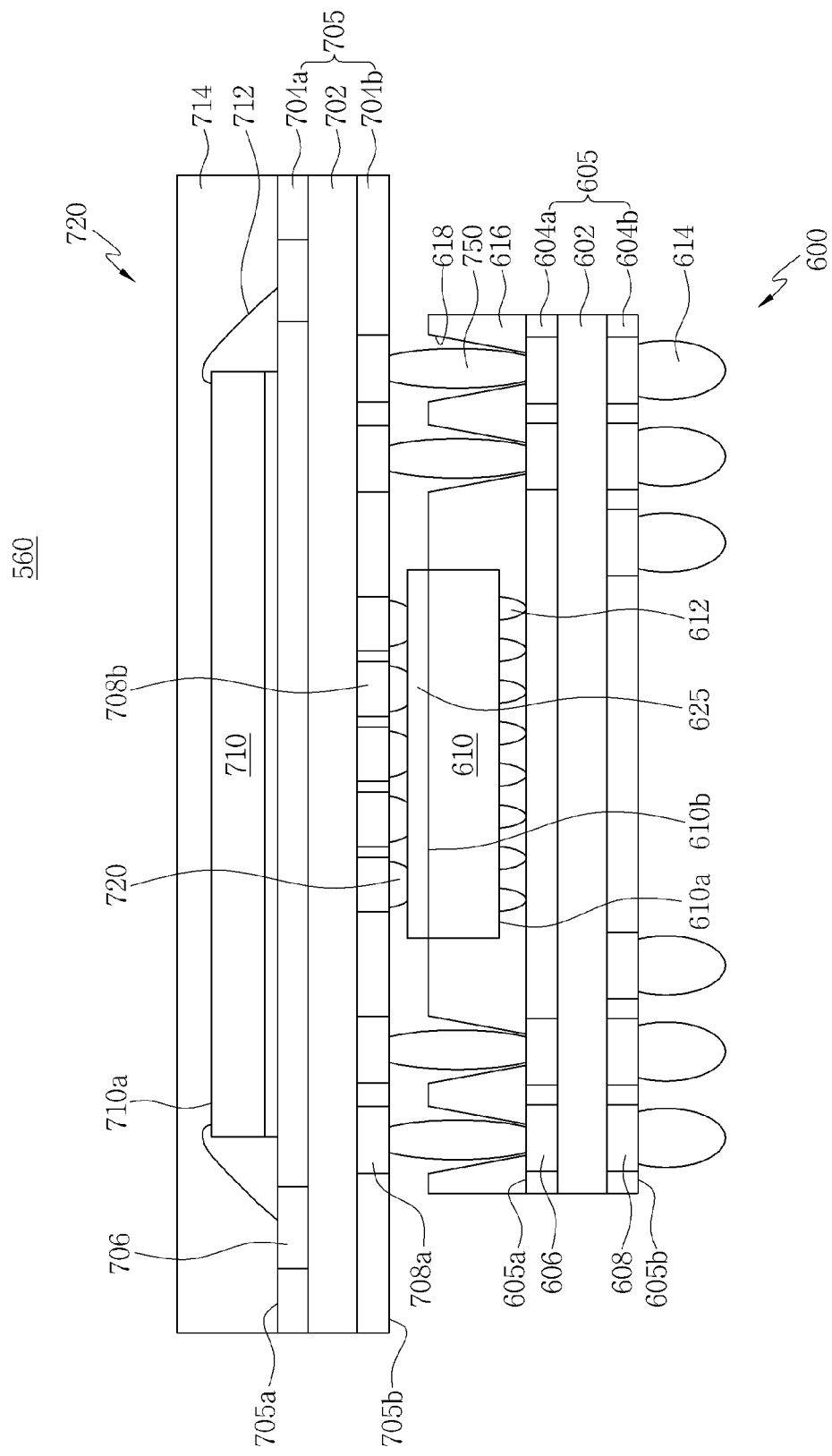

Referring to FIG. 11, a stack type semiconductor package 560 according to another embodiment may include a lower semiconductor package 600, an upper semiconductor package 700, an inter-package connection unit 750 that electrically connects the lower and upper semiconductor packages 600 and 700, a heat dissipation member 625, and an interconnection unit 720.

The lower semiconductor package 600 may include a lower package substrate 605, a lower semiconductor chip 610 that is mounted on the lower package substrate 605, and a lower molding material 616 that is formed on the lower package substrate 605 and surrounds a side surface of the lower semiconductor chip 610. The lower semiconductor chip 610 may include a logic device. The lower semiconductor chip 610 may be connected to the lower package substrate 605 using a flip chip method.

The upper semiconductor package 700 may include an upper package substrate 705 that has a size greater than that of the lower package substrate 605, an upper semiconductor chip 710 that is mounted on the upper package substrate 705, and an upper molding material 714 that is formed on the upper package substrate 705 to cover an active surface 710a of the upper semiconductor chip 710. The upper semiconductor chip 710 may include a memory device. Since the upper package substrate 705 has a size greater than that of the lower package substrate 605, the upper package substrate 705 may increase a storage capacity by increasing a size of the upper semiconductor chip 710 or horizontally stacking a plurality of the upper semiconductor chips 710.

The heat dissipation member 625 may include a metal layer, e.g., a Cu layer, fully plated on a second surface 610b of the lower semiconductor chip 610. The heat dissipation member 625 may be formed to have the same area as that of the lower semiconductor chip 610.

The interconnection unit 720 may be formed on a portion of a bottom surface 705b of the upper package substrate 705 which corresponds to the lower semiconductor chip 610. The interconnection unit 720 may be adhered to the heat dissipation member 625 to connect the lower semiconductor chip 610 and the upper package substrate 705. The interconnection unit 720 may be formed of a solder material such as a solder ball.

Heat generated in the lower semiconductor chip 610 may be transferred through the heat dissipation member 625 and the interconnection unit 720 to the upper semiconductor package 700 such that the heat is dissipated to the outside air.

Figure 12:
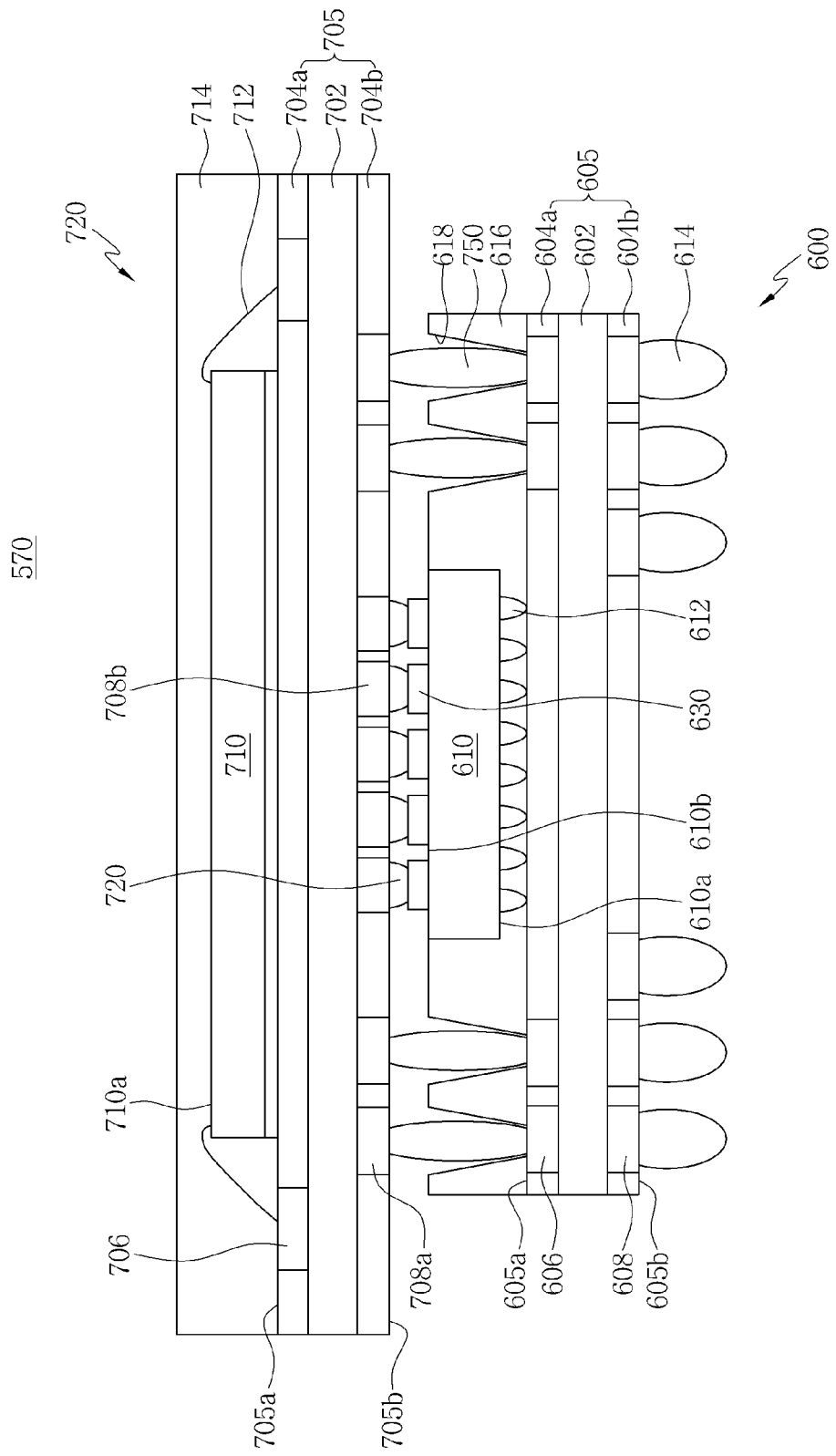

Referring to FIG. 12, a stack type semiconductor package 570 according to another embodiment may include the lower semiconductor package 600 including the lower package substrate 605 and the lower semiconductor chip 610 that is mounted on the lower package substrate 605, the upper semiconductor package 700 including the upper package substrate 705 that has a size greater than that of the lower package substrate 605 and the upper semiconductor chip 710 that is mounted on the upper package substrate 705, the inter-package connection unit 750 that electrically connects the lower and upper semiconductor packages 600 and 700, a heat dissipation member 630, and the interconnection unit 720.

The heat dissipation member 630 may include a plurality of metal patterns that are formed on the second surface 610b of the lower semiconductor chip 610 using an inkjet printing method.

The interconnection unit 720 may include a plurality of solder balls that are formed on a portion of the bottom surface 705b of the upper package substrate 705 which corresponds to the lower semiconductor chip 610. The metal patterns of the heat dissipation member 630 may be formed to respectively correspond to the solder balls of the interconnection unit 720.

Heat generated in the lower semiconductor chip 610 may be transferred through the heat dissipation member 630 and the interconnection unit 720 to the upper semiconductor package 700 such that the heat is dissipated to the outside air.

Figure 13:
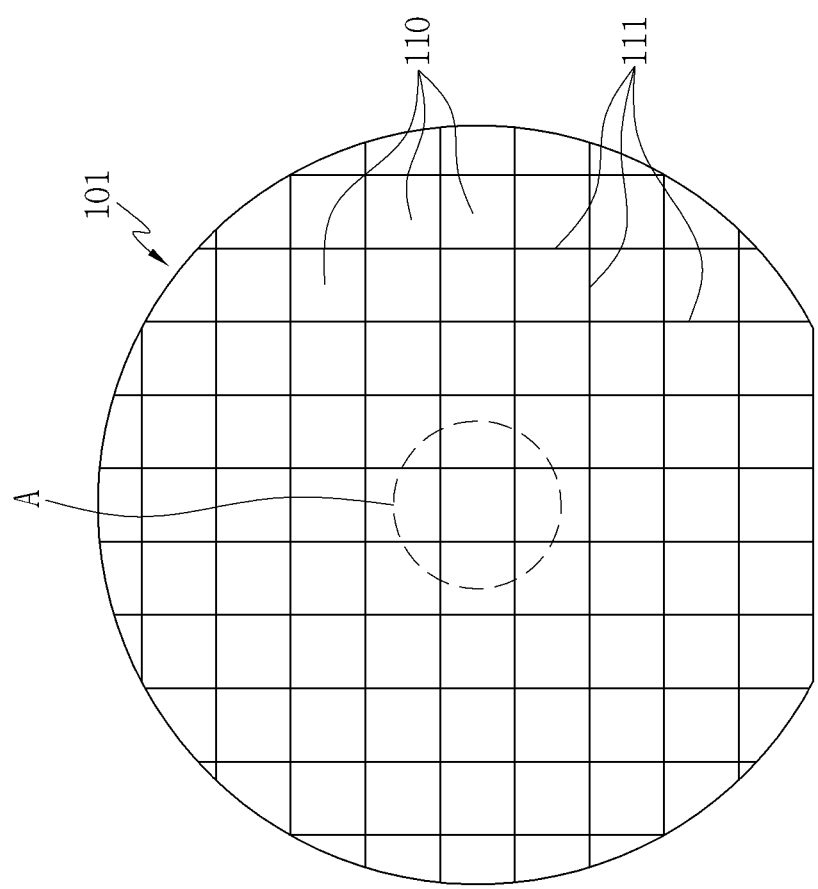
FIG. 13 is a plan view illustrating a semiconductor wafer used to manufacture a stack type semiconductor package, according to an embodiment.

FIG. 13 is a plan view illustrating a semiconductor wafer 101 used to manufacture a stack type semiconductor package, according to an embodiment. FIGS. 14A through 14D are cross-sectional views for describing a method of manufacturing a stack type semiconductor package, according to an embodiment. FIGS. 15A and 15B are enlarged cross-sectional views illustrating a portion B of FIG. 14D.

A method of manufacturing a stack type semiconductor package according to an embodiment of the inventive concept will be explained with reference to FIGS. 13 through 15B.

Referring to FIGS. 13 and 14A, the semiconductor wafer 101 on which a plurality of circuit regions are formed may be prepared.

Semiconductor devices may be respectively formed in the circuit regions. Each of the semiconductor devices may include a logic device such as a microprocessor, a microcontroller, or an application processor.

A plurality of chip pads provided as an input/output terminal of an electrical signal may be formed on an active surface of the semiconductor wafer 101, i.e., on a surface on which the circuit regions are formed. The plurality of chip bumps 112 may be respectively attached to the chip pads. Each of the chip bumps 112 may include a solder material, or a metal such as Au, Ag, Pt, Al, Cu, or Ni.

The heat dissipation member 125 may be formed on a back surface of the semiconductor wafer 101. The heat dissipation member 125 may be formed of a metal material having high thermal conductivity such as Cu, Ni, Al, Au, Ag, or an alloy thereof. The heat dissipation member 125 may be formed on the entire back surface of the semiconductor wafer 101 using a plating method.

Referring to FIGS. 13 and 14B, in order to minimize a thickness of the stack type semiconductor package, the back surface of the semiconductor wafer 101 may be polished. The polishing process may be a grinding process performed in a state where physical pressure is applied.

After the semiconductor wafer 101 is loaded on a chuck table 800 of a cutting apparatus, the semiconductor wafer 101 may be cut using a sawing blade 810. As the semiconductor wafer 101 is cut along a chip scribe line 111, a plurality of the lower semiconductor chips 110 that are separated in units of chips may be obtained. The heat dissipation member 125 may be cut into parts that each has the same area as that of each of the lower semiconductor chips 110.

Figure 14C:
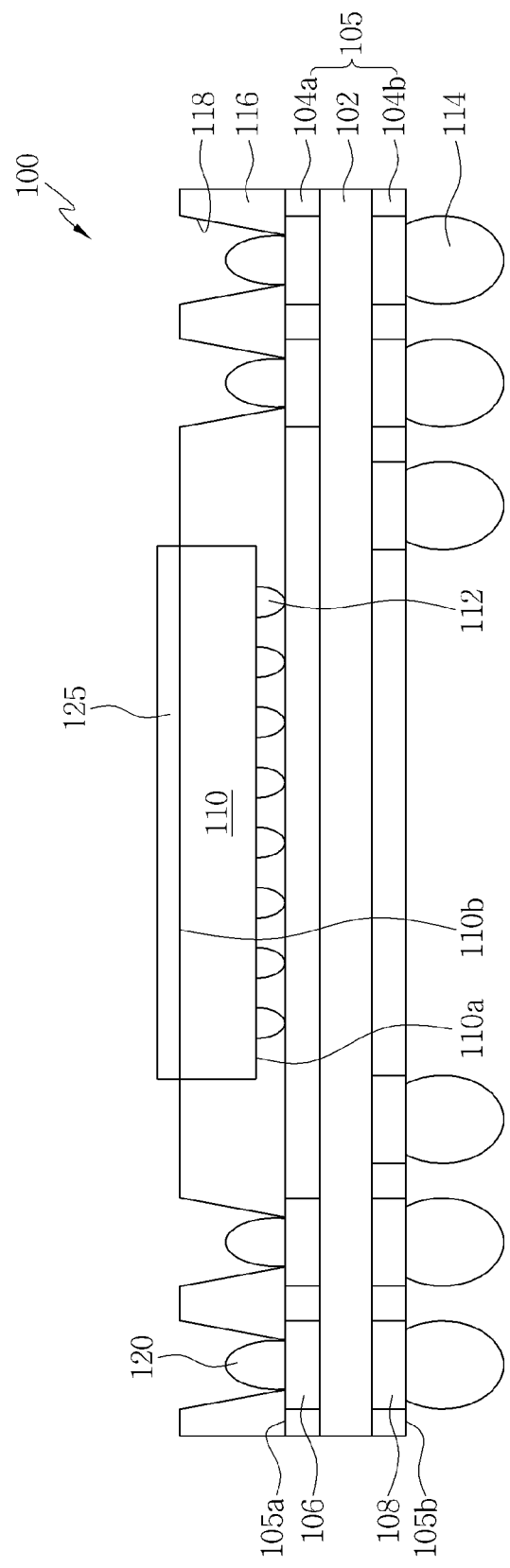

FIG. 14C is an enlarged cross-sectional view illustrating a portion A of FIG. 13. One of the lower semiconductor chips 110 is mounted on the lower package substrate 105.

Referring to FIG. 14C, the lower package substrate 105 including the lower core layer 102, the first and second lower solder resist layers 104a and 104b, and the first and second lower lands 106 and 108 may be prepared.

Examples of the lower package substrate 105 which is a substrate on which a plurality of lower wiring lines are formed may include a rigid PCB, a flexible PCB, and a rigid-flexible PCB. The plurality of lower wiring lines may be formed in the lower core layer 102 constituting the lower package substrate 105.

The first lower lands 106 formed on the top surface 105a of the lower package substrate 105 may be insulated from one another by the first lower solder resist layer 104a. The second lower lands 108 formed on the bottom surface 105b of the lower package substrate 105 may be insulated from one another by the second lower solder resist layer 104b. The first lower lands 106 may be electrically connected to the second lower lands 108 through the lower wiring lines. Each of the first and second lower lands 106 and 108 may include Cu, Ni, Au, or a solder material.

The lower semiconductor chip 110 having the first surface 110a on which the chip pads are formed and the second surface 110b on which the heat dissipation member 125 is formed may be mounted on the lower package substrate 105 using a flip chip method. In other words, the lower semiconductor chip 110 may be disposed such that the first surface 110a provided as an active surface on which the chip pads are formed faces the top surface 105a of the lower package substrate 105, and then may be directly connected to the lower package substrate 105 using the chip bumps 112 that are attached to the chip pads. The chip pads formed on the first surface 110a of the lower semiconductor chip 110 may be electrically connected to the first lower lands 106 of the lower package substrate 105 through the plurality of lower wiring lines and the chip bumps 112.

The lower semiconductor chip 110 may include a logic semiconductor device such as a microprocessor, a microcontroller, or an application processor. The lower semiconductor chip 110 may be an SOC that integrates various types of semiconductor devices into a single semiconductor chip.

The lower molding material 116 may be formed on the lower package substrate 105 to expose a back surface, i.e., the second surface 110b, of the lower semiconductor chip 110. The lower molding material 116 for protecting electrical connection between the lower semiconductor chip 110 and the lower package substrate 105 may be formed to surround the lower semiconductor chip 110 and the chip bumps 112. Also, the lower molding material 116 may reduce stress applied to the top surface 105a of the lower package substrate 105. The lower molding material 116 may include an epoxy resin or an EMC.

A lower connection unit 120 may be formed on the first lower lands 106 of the lower package substrate 105. The lower connection unit 120 may include Cu, Ni, Au, or a solder material. The lower connection unit 120 may be formed using a screen printing process or a soldering process. The lower connection unit 120 may be formed to have the same arrangement as that of the first lower lands 106.

The via hole 118 may be formed by selectively removing the lower molding material 116 using a laser drilling process to expose a portion of a surface of the lower connection unit 120. The via hole 118 may be formed to expose a top surface and/or a side surface of the lower connection unit 120, or a portion of a surface of the first lower solder resist layer 104a.

The lower connection unit 120 may be formed before the via hole 118 is formed as described above, or may be formed after the via hole 118 is formed. The lower connection unit 120 may be formed such that the top surface of the lower connection unit 120 is lower than a top surface of the via hole 118.

The external connection members 114 may be formed on the bottom surface 105b of the lower package substrate 105. The external connection members 114 may be formed to have the same arrangement as that of the second lower lands 108. Each of the external connection members 114 may be formed of a solder material such as a solder ball, a solder bump, or solder paste, or may be formed of a metal having a spherical shape, a mesa shape, or a pin shape. The external connection members 114 may be arranged as a grid type for embodying a BGA package.

As such, the lower semiconductor package 100 including the lower package substrate 105 including the first and second lower lands 106 and 108, the lower semiconductor chip 110, the chip bumps 112, the external connection members 114, the lower molding material 116, the lower connection unit 120, and the heat dissipation member 125 may be completed. Since the lower semiconductor package 100 is formed using a laser drilling process, the lower semiconductor package 100 may be referred to as a laser drill package (LDP).

Figure 14D:
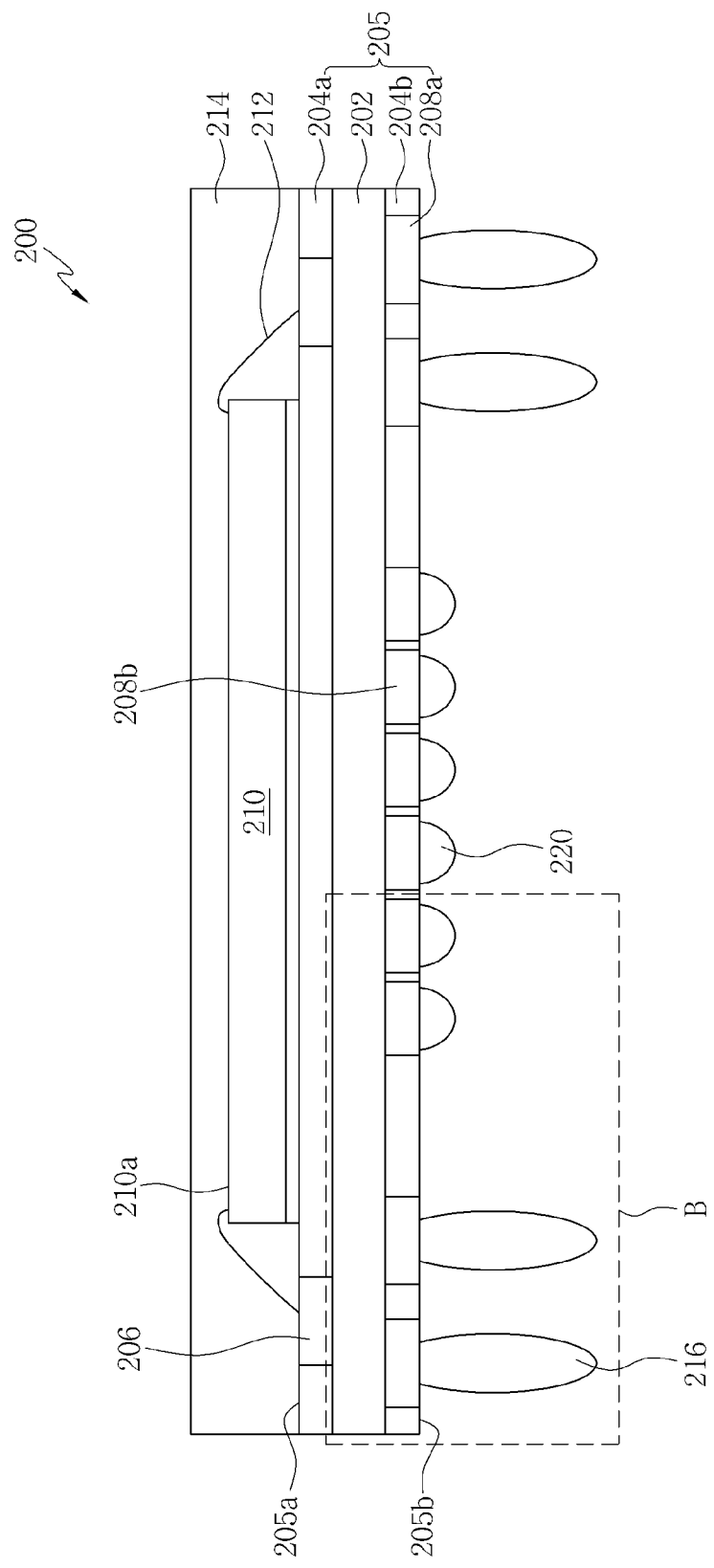

Referring to FIG. 14D, the upper semiconductor package 200 may be prepared.

The upper semiconductor package 200 may include the upper package substrate 205 including the upper core layer 202 and the first and second upper solder resist layers 204a and 204b.

Examples of the upper package substrate 205 which is a substrate on which a plurality of upper wiring lines are formed may include a rigid PCB, a flexible PCB, and a rigid-flexible PCB. The plurality of upper wiring lines may be formed in the upper core layer 202 constituting the upper package substrate 205. A ground voltage and a power supply voltage may be applied to the plurality of upper wiring lines.

The first upper lands 206 that are insulated from one another by the first upper solder resist layer 204a may be formed on the top surface 205a of the upper package substrate 205. The second upper lands 208a and the third upper lands 208b that are each insulated from one another by the second upper solder resist layer 204b may be formed on the bottom surface 205b of the upper package substrate 205. The first upper lands 206 may be electrically connected to the second upper lands 208a through the upper wiring lines. The third upper lands 208b may be formed not to be electrically connected to the first and second upper lands 206 and 208a. Each of the first, second, and third upper lands 206, 208a, and 208b may include a metal such as Cu, Ni, or Au, or a solder material.

The upper semiconductor chip 210 may be mounted on the top surface 205a of the upper package substrate 205 with an adhesive layer such as a die attach film (DAF) therebetween. The upper semiconductor chip 210 may have the active surface 210a on which chip pads are formed, and may include a memory device. The upper semiconductor chip 210 may be electrically connected to the first upper lands 206 of the upper package substrate 205 through the wires 212. The wires 212 may include Au, Ag, Pt, Al, Cu, Ni, cobalt (Co), chromium (Cr), or titanium (Ti).

The upper molding material 214 may be formed on the upper package substrate 205 to surround and protect the wires 212 and the active surface 210a of the upper semiconductor chip 210. The upper molding material 214 may include an epoxy resin or an EMC.

An upper connection unit 216 and the interconnection unit 220 may be formed on the second upper lands 208a and the third upper lands 208b that are disposed on the bottom surface 205b of the upper package substrate 205. Each of the upper connection unit 216 and the interconnection unit 220 may include a solder material. Each of the upper connection unit 216 and the interconnection unit 220 may be formed using a soldering process. The upper connection unit 216 and the interconnection unit 220 may be formed to have different heights.

FIGS. 15A and 15B are enlarged cross-sectional views illustrating a portion B of FIG. 14D. A method of forming the upper connection unit 216 and the interconnection unit 220 will be explained in detail.

Referring to FIG. 15A, the second upper solder resist layer 204b may be formed on the upper core layer 202 that is provided as a body of the upper package substrate 205 to partially cover the second and third upper lands 208a and 208b.

The second upper solder resist layer 204b may include a first opening 218 through which the second upper lands 208a are each exposed, and a second opening 219 through which the third upper lands 208b are each exposed.

A size s1 of the first opening 218 may be less than a size s2 of the second opening 219. In other words, the second upper lands 208a and the third upper lands 208b may have different exposure sizes.

Referring to FIG. 15B, the upper connection unit 216 and the interconnection unit 220 each having a solder ball shape may be respectively formed on the second upper lands 208a and the third upper lands 208b using a soldering process.

Sizes of the upper connection unit 216 and the interconnection unit 220 are determined according to sizes of the first and second openings 218 and 219 defined by the second upper solder resist layer 204b. When an exposure size of an upper land, i.e., a size of an opening is set to a largest one, even though a solder ball having the same volume is formed, the solder ball may be formed at a low height. Accordingly, a height h2 of the interconnection unit 220 formed on the third upper lands 208b having the larger exposure size s2 may be less than a height h1 of the upper connection unit 216 formed on the second upper lands 208a having the smaller exposure size s1. Since the interconnection unit 220 is provided as a heat transfer path between the lower semiconductor chip 110 and the upper package substrate 205, it is no problem that adjacent interconnection units 220 contact each other. Accordingly, the exposure size s2 of the third upper lands 208b may increase such that adjacent interconnection units 220 contact each other.

Also, when the exposure sizes s1 and s2 of the second and third upper lands 208a and 208b are set to be the same, since a solder ball having a smaller volume is used for the third upper lands 208b and a solder ball having a larger volume is used for the second upper lands 208a using an additional solder mask process, a height of the solder ball formed on the third upper lands 208b may be reduced.

In other words, the upper connection unit 216 and the interconnection unit 220 may be formed to have different heights by differing the exposure sizes s1 and s2 of the second and third upper lands 208a and 208b or differing volumes of solder balls.

In a related art, a substrate in which central portions of lands are exposed by a solder resist layer is referred to as a solder mask defined (SMD) substrate, and a substrate in which entire top surfaces of the lands are exposed is referred to as a non solder mask defined (NSMD) substrate. In the SMD substrate, exposure sizes of the lands may be determined according to sizes of openings defined by the solder resist layer. By contrast, in the NSMD substrate, since actual sizes of the lands are exposure sizes, the upper connection unit 216 and the interconnection unit 220 may be formed to have different heights only when the lands are formed to have different sizes.

As such, the upper semiconductor package 200 including the upper package substrate 205, the upper semiconductor chip 210, the upper molding material 214, the upper connection unit 216, and the interconnection unit 220 may be completed (see FIG. 14D).

The upper semiconductor package 200 of FIG. 14D may be vertically stacked on the lower semiconductor package 100 of FIG. 14C.

A solder joint process for integrating the upper connection unit 216 of the upper semiconductor package 200 and the lower connection unit 120 of the lower semiconductor package 100 may be performed. As shown in FIG. 1, as solders of the lower connection unit 120 and the upper connection unit 216 reflow to be integrated due to the solder joint process, the inter-package connection unit 250 that connects the top surface 105a of the lower package substrate 105 and the bottom surface 205b of the upper package substrate 205 may be formed.

Also, the interconnection unit 220 formed on the third upper lands 208b of the upper package substrate 205 may be adhered to the heat dissipation member 125 formed on the second surface 110b of the lower semiconductor chip 110 due to the solder joint process. Accordingly, heat generated in the lower semiconductor chip 110 may be transferred through the heat dissipation member 125 and the interconnection unit 220 to a body and a surface of the upper semiconductor package 200, and then may be smoothly dissipated to the outside air.

Before the solder joint process is performed, the upper connection unit 216 may be flux-dotted. A flux is a material for chemically activating a metal in order to easily connect the metal to a solder material. A flux may be dotted on the upper connection unit 216 to have a size and a pattern desired by the stack type semiconductor package.

Also, if necessary, before the solder joint process is performed, a process of cleaning surfaces of the lower connection unit 120 and the upper connection unit 216 may be further performed. The cleaning process may facilitate the integration of the lower connection unit 120 and the upper connection unit 216, and may ensure sufficient electrical conductivity.

Methods of manufacturing a stack type semiconductor package according to various embodiments will be explained focusing on differences and omitting repetitions.

Figure 16A:
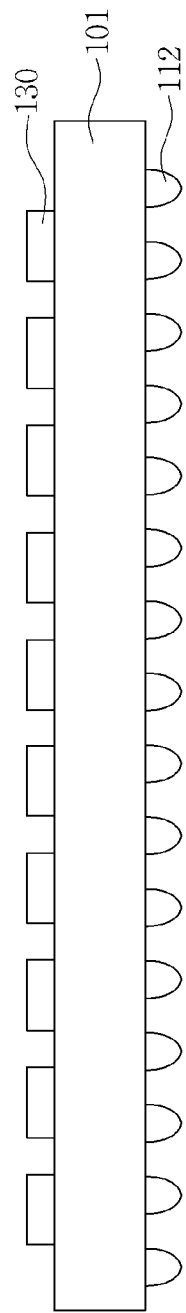
FIGS. 16A through 16C are cross-sectional views for describing a method of manufacturing a stack type semiconductor package, according to another embodiment.
Figure 16B:
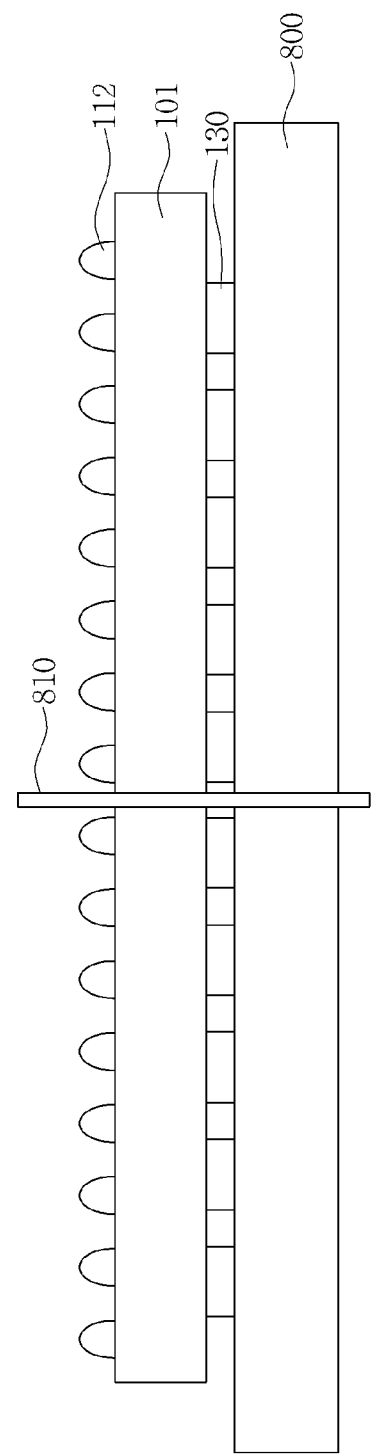
Figure 16C:
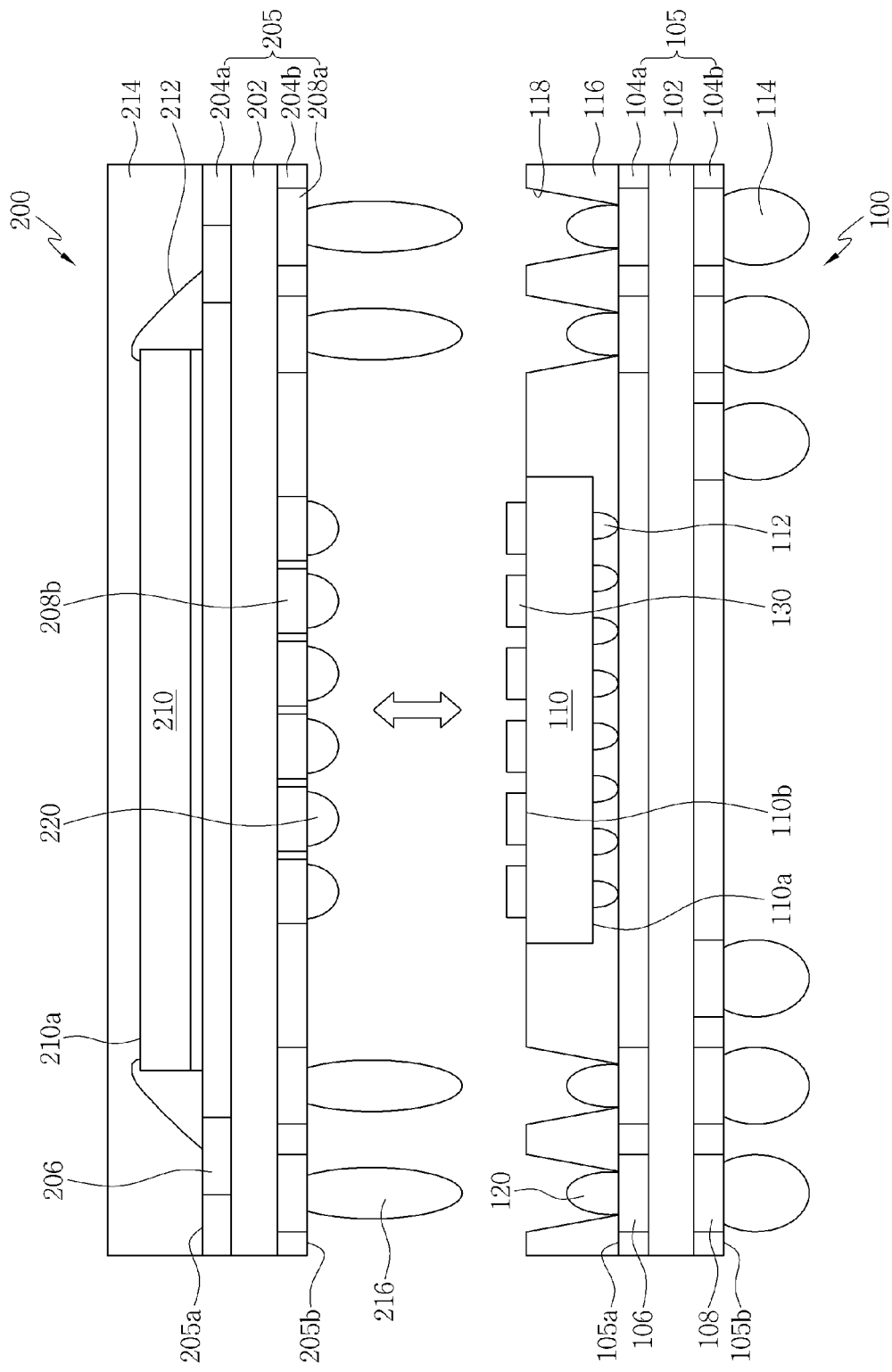

FIGS. 16A through 16C are cross-sectional views for describing a method of manufacturing a stack type semiconductor package, according to another embodiment.

Referring to FIGS. 13 and 16A, the semiconductor wafer 101 on which circuit regions are formed may be prepared.

Semiconductor devices may be respectively formed in the circuit regions. A plurality of chip pads provided as an input/output terminal of an electrical signal may be formed on an active surface of the semiconductor wafer 101, i.e., on a surface on which the circuit regions are formed. The plurality of chip bumps 112 may be respectively attached to the chip pads.

The heat dissipation member 130 may be formed on a back surface of the semiconductor wafer 101. The heat dissipation member 130 may be formed of a metal material having high thermal conductivity such as Cu, Ni, Al, Au, Ag, or an alloy thereof. The heat dissipation member 130 may include a plurality of metal patterns that are formed using an inkjet printing method. The heat dissipation member 130 may be formed to have a circular shape, a quadrangular shape, an oval shape, a cross shape, or a combination thereof.

An inkjet printing method which is a technology capable of directly forming metal patterns without exposure/etching/plating processes involves ejecting ink including metal particles onto a substrate, printing metal patterns, and then performing annealing on the metal patterns. The substrate on which the metal patterns are formed is subjected to the annealing in order to remove a solvent of the ink and provide electrical conductivity high enough to deposit the metal particles.

Referring to FIGS. 13 and 16B, in order to minimize a thickness of the stack type semiconductor package, the back surface of the semiconductor wafer 101 may be polished using a grinding process.

After the semiconductor wafer 101 is loaded on the chuck table 800 of the cutting apparatus, the semiconductor wafer 101 may be cut using the sawing blade 810. As the semiconductor wafer 101 is cut along the chip scribe line 111, a plurality of the lower semiconductor chips 110 that are separated in units of chips may be obtained.

Referring to FIG. 16C, the lower package substrate 105 including the lower core layer 102, the first and second lower solder resist layers 104a and 104b, and the first and second lower lands 106 and 108 may be prepared.

The lower semiconductor chip 110 having the first surface 110a on which the chip pads are formed and the second surface 110b on which the heat dissipation member 125 is formed may be mounted on the lower package substrate 105 using a flip chip method. The chip pads formed on the first surface 110a of the lower semiconductor chip 110 may be electrically connected to the first lower lands 106 through a plurality of lower wiring lines and the chip bumps 112.

The lower molding material 116 may be formed on the lower package substrate 105 to expose a back surface, i.e., the second surface 110b, of the lower semiconductor chip 110.

After the lower connection unit 120 is formed on the first lower lands 106 of the lower package substrate 105, the via hole 118 may be formed by selectively removing the lower molding material 116 using a laser drilling process to expose a surface of the lower connection unit 120. The lower connection unit 120 may be formed such that a top surface of the lower connection unit is lower than a top surface of the via hole 118. Alternatively, the lower connection unit 120 may be formed after the via hole 118 is formed.

The external connection members 114 may be formed on the second lower lands 108 of the lower package substrate 105.

As such, the lower semiconductor package 100 including the lower package substrate 105, the lower semiconductor chip 110, the chip bumps 112, the external connection members 114, the lower molding material 116, the lower connection unit 120, and the heat dissipation member 130 may be completed.

The upper semiconductor package 200 may be prepared. The upper semiconductor package 200 may include the upper package substrate 205 including the upper core layer 202 and the first and second upper solder resist layers 204a and 204b, the upper semiconductor chip 210 that is mounted on the top surface 205a of the upper package substrate 205, and the upper molding material 214 that is formed on the upper package substrate 205 to cover the active surface 210a of the upper semiconductor chip 210.

The upper package substrate 205 may include the first upper lands 206 that are formed on the top surface 205a of the upper package substrate 205 and are insulated from one another by the first upper solder resist layer 204a, and the second upper lands 208a and the third upper lands 208b that are formed on the bottom surface 205b of the upper package substrate 205 and are each insulated from one another by the second upper solder resist layer 204b. The first upper lands 206 may be electrically connected to the second upper lands 208a through upper wiring lines. The third upper lands 208b may be formed not to be electrically connected to the first and second upper lands 206 and 208a.

The upper connection unit 216 and the interconnection unit 220 may be respectively formed on the second upper lands 208a and the third upper lands 208b of the upper package substrate 205. Each of the upper connection unit 216 and the interconnection unit 220 may be formed using a soldering process. As shown in FIG. 15B, the upper connection unit 216 and the interconnection unit 220 may be formed to have different heights. In other words, as the second upper lands 208a and the third upper lands 208b are formed to have different exposure sizes, the interconnection unit 220 formed on the third upper lands 208b having the larger exposure size s2 may be formed to have the height h2 less than the height h1 of the upper connection unit 216 formed on the second upper lands 208a having the smaller exposure size s1.

A solder joint process for integrating the upper connection unit 216 of the upper semiconductor package 200 and the lower connection unit 120 of the lower semiconductor package 100 may be performed. As shown in FIG. 3, as solders of the lower connection unit 120 and the upper connection unit 216 reflow to be integrated due to the solder joint process, the inter-package connection unit 250 that connects the top surface 105a of the lower package substrate 105 and the bottom surface 205b of the upper package substrate 205 may be formed.

Due to the solder joint process, the interconnection unit 220 formed on the third upper lands 208b of the upper package substrate 205 may be adhered to the heat dissipation member 130 formed on the second surface 110b of the lower semiconductor chip 110. The heat dissipation member 130 including a plurality of metal patterns may be adhered such that the metal patterns respectively correspond to a plurality of the interconnection units 220. Heat generated in the lower semiconductor chip 110 may be transferred through the heat dissipation member 130 and the interconnection unit 220 to a body and a surface of the semiconductor package 200, and then may be smoothly dissipated to the outside air.

Figure 17A:
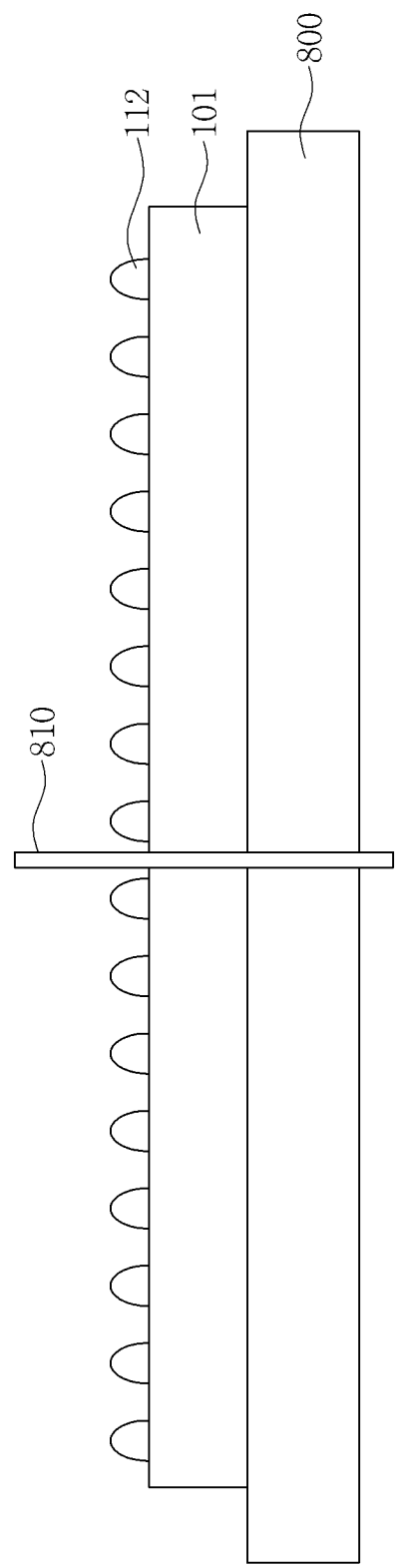
FIGS. 17A through 17C are cross-sectional views for describing a method of manufacturing a stack type semiconductor package, according to another embodiment.
Figure 17B:
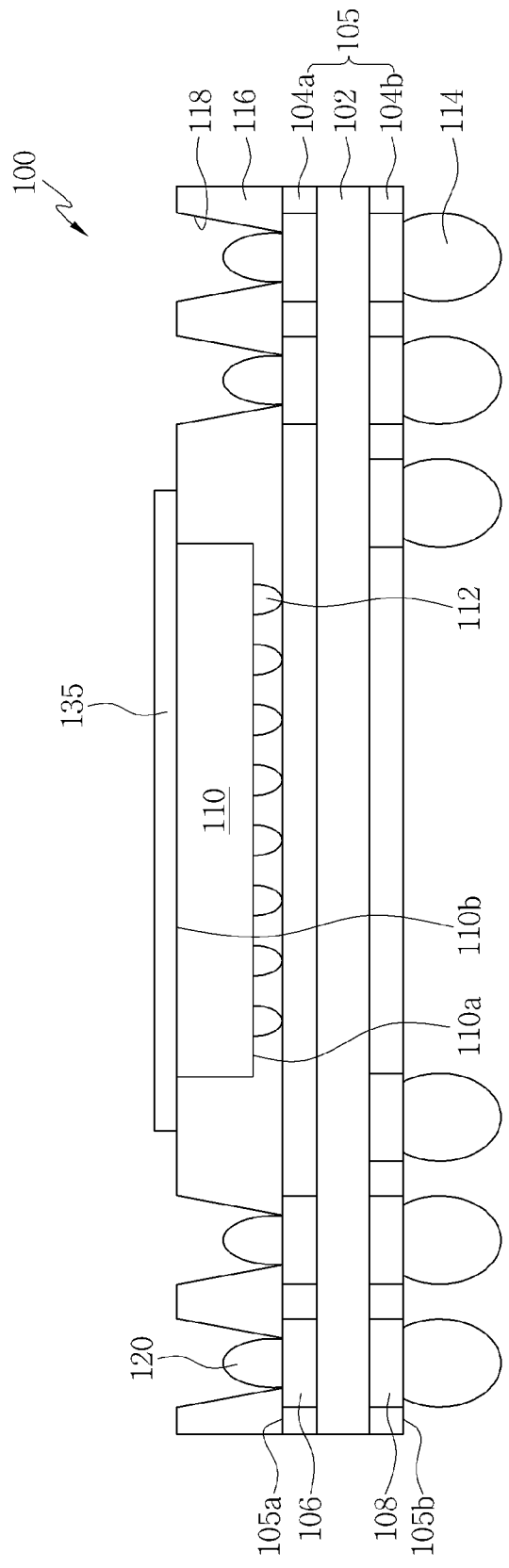
Figure 17C:
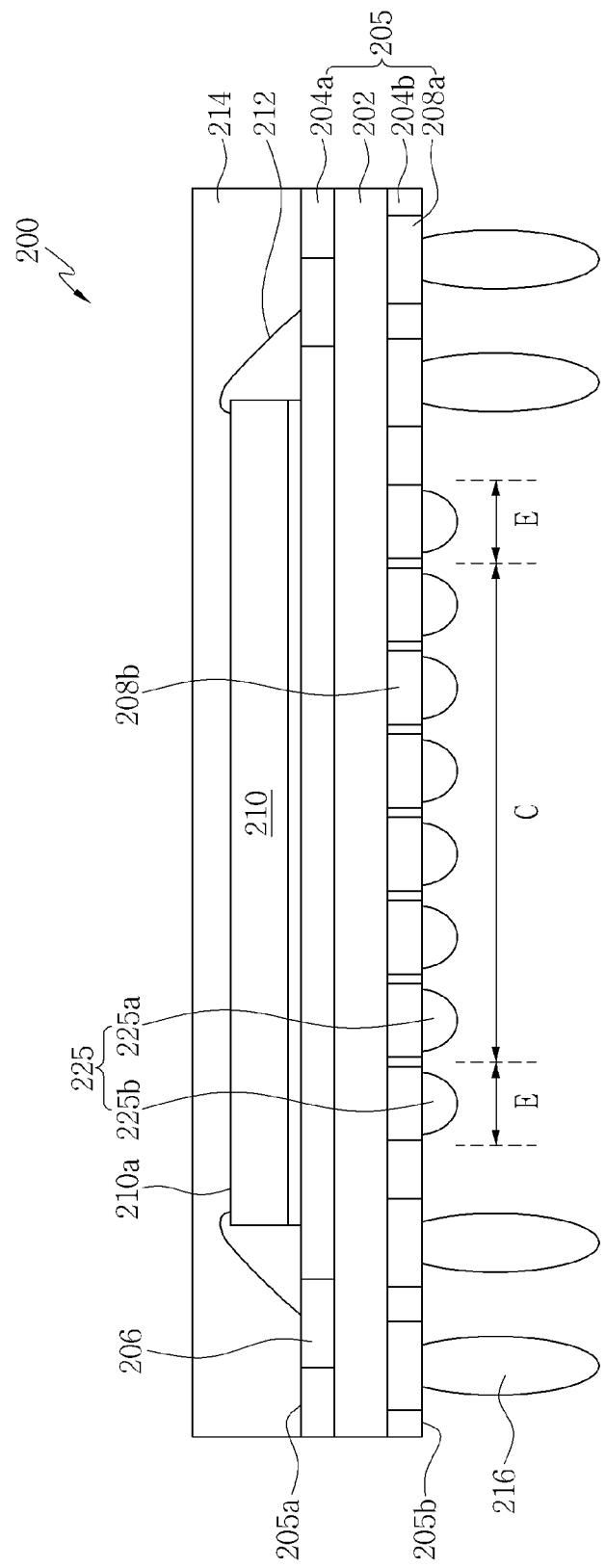

FIGS. 17A through 17C are cross-sectional views for describing a method of manufacturing a stack type semiconductor package, according to another embodiment.

Referring to FIGS. 13 and 17A, the semiconductor wafer 101 on which circuit regions are formed may be prepared.

A plurality of chip pads provided as an input/output terminal of an electrical signal may be formed on an active surface of the semiconductor wafer 101, i.e., on a surface on which the circuit regions are formed. The plurality of chip bumps 112 may be respectively attached to the chip pads.

A back surface of the semiconductor wafer 101 may be polished using a grinding process in order to minimize a thickness of the stack type semiconductor package, and then the semiconductor wafer 101 is cut along the chip scribe line 111 using the sawing blade 810 to obtain a plurality of the lower semiconductor chips 110 that are separated in units of chips.

Referring to FIG. 17B, the lower package substrate 105 including the lower core layer 102, the first and second lower solder resist layers 104a and 104b, and the first and second lower lands 106 and 108 may be prepared.

The lower semiconductor chip 110 having the first surface 110a on which chip pads are formed may be mounted on the lower package substrate 105 using a flip chip method. The chip pads formed on the first surface 110a of the lower semiconductor chip 110 may be electrically connected to the first lower lands 106 of the lower package substrate 105 through a plurality of lower wiring lines and the chip bumps 112.

The lower molding material 116 may be formed on the lower package substrate 105 to expose a back surface, i.e., the second surface 110b, of the lower semiconductor chip 110.

The heat dissipation member 135 may be formed on a top surface of the lower semiconductor package 100. The heat dissipation member 135 may be formed to cover the second surface 110b of the lower semiconductor chip 110 and to extend to a portion of a top surface of the lower molding material 116. The heat dissipation member 135 may include a metal layer formed using a plating method.

The lower connection units 120 may be formed on the top surface 105a of the lower package substrate 105, and the external connection members 114 may be formed on the bottom surface 105b of the lower package substrate 105.

Referring to FIG. 17C, the upper semiconductor package 200 may be prepared.

The upper semiconductor package 200 may include the upper package substrate 205, the upper semiconductor chip 210 that is mounted on the upper package substrate 205, and the upper molding material 214 that is formed on the upper package substrate 205 to cover the active surface 210a of the upper semiconductor chip 210.

The upper connection unit 216 and the interconnection unit 225 may be formed on the bottom surface 205b of the upper package substrate 205. The upper connection unit 216 and the interconnection unit 225 may be formed using a soldering process. The upper connection unit 216 and the interconnection unit 225 may be formed to have different heights. The upper connection unit 216 and the interconnection unit 225 may be formed not to contact each other.

The interconnection unit 225 may include the first interconnection unit 225a that is formed on a first region C corresponding to the lower semiconductor chip 110, and the second interconnection unit 225b that is formed on a second region E surrounding the first region C.

As shown in FIG. 5, as a solder joint process for integrating the upper connection unit 216 of the upper semiconductor package 200 and the lower connection unit 120 of the lower semiconductor package 100 is performed, the inter-package connection unit 250 that connects the top surface 105a of the lower package substrate 105 and the bottom surface 205b of the upper package substrate 205 may be formed.

Due to the solder joint process, the interconnection unit 225 formed on the bottom surface 205b of the upper package substrate 205 may be adhered to the heat dissipation member 135 formed on the second surface 110b of the lower semiconductor chip 110. Heat generated in the lower semiconductor chip 110 and heat generated in the lower molding material 116 that surrounds the lower semiconductor chip 110 may be transferred through the heat dissipation member 135 and the interconnection unit 225 to the upper semiconductor package 200 such that the heat is dissipated to the outside air.

Figure 18:
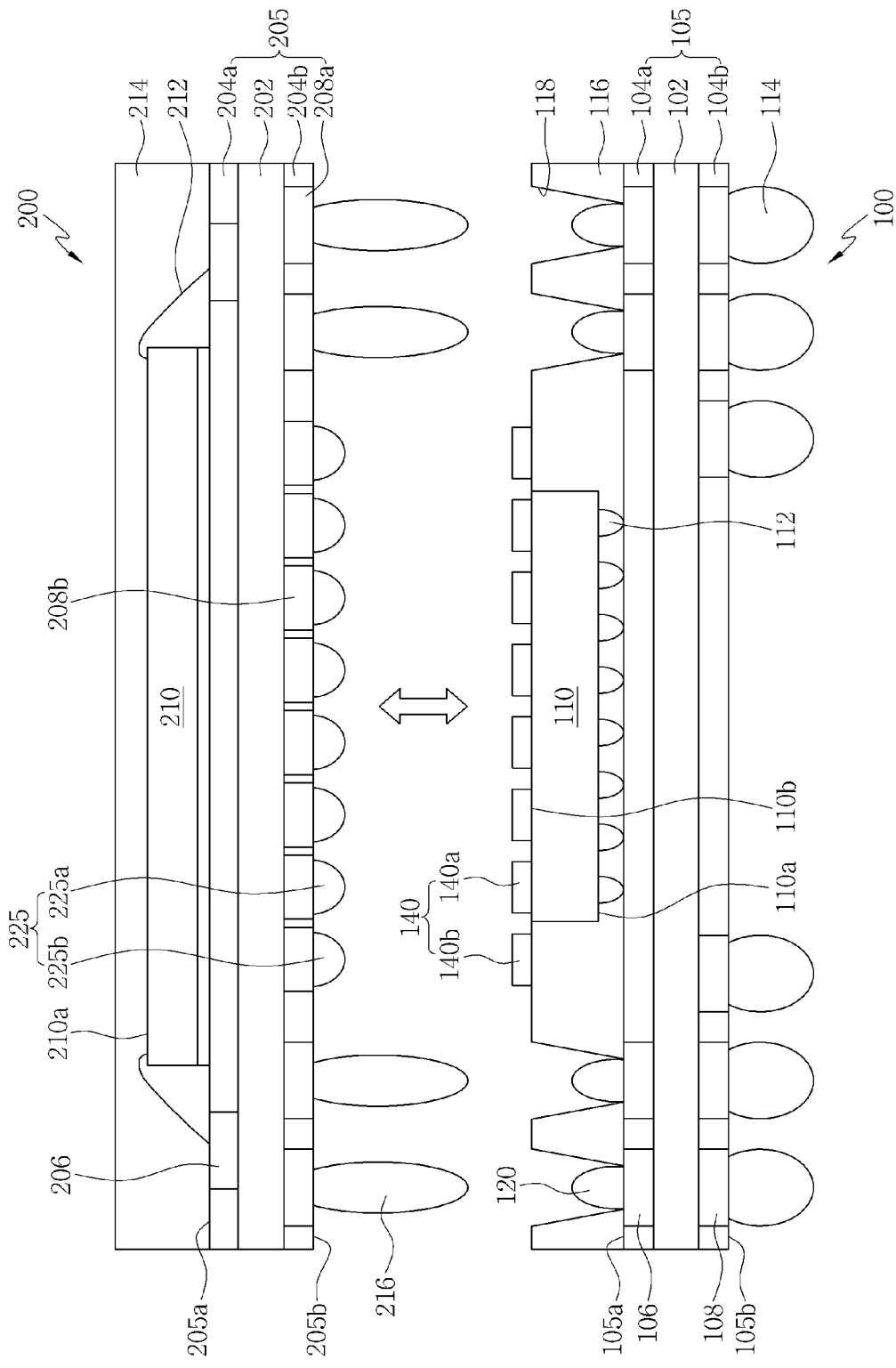
FIG. 18 is a cross-sectional view for describing a method of manufacturing a stack type semiconductor package, according to another embodiment.

FIG. 18 is a cross-sectional view for describing a method of manufacturing a stack type semiconductor package, according to another embodiment.

Referring to FIG. 18, processes described above with reference to FIG. 17A may be performed on the semiconductor wafer 101 on which circuit regions are formed, to obtain a plurality of the lower semiconductor chips 110 that are separated in units of chips.

Next, each of the lower semiconductor chips 110 may be formed using a flip chip process on the lower package substrate 105 including the lower core layer 102, the first and second lower solder resist layers 104a and 104b, and the first and second lower lands 106 and 108.

The lower molding material 116 may be formed on the lower package substrate 105 to expose a back surface, i.e., the second surface 110b, of the lower semiconductor chip 110.

The heat dissipation member 140 may be formed on a top surface of the lower semiconductor package 100. The heat dissipation member 140 may include a plurality of metal patterns that are formed using an inkjet printing method. The heat dissipation member 140 may be formed to have a circular shape, a quadrangular shape, an oval shape, a cross shape, or a combination thereof. The heat dissipation member 140 may include the first heat dissipation member 140a that is formed on the second surface 110b of the lower semiconductor chip 110 and the second heat dissipation member 140b that is formed on a portion of a top surface of the lower molding material 116.

The lower connection units 120 may be formed on the top surface 105a of the lower package substrate 105, and the external connection members 114 may be formed on the bottom surface 105b of the lower package substrate 105.

The upper semiconductor package 200 may be prepared.

The upper semiconductor package 200 may include the upper package substrate 205, the upper semiconductor chip 210 that is mounted on the upper package substrate 205, and the upper molding material 214 that is formed on the upper package substrate 205 to cover the active surface 210a of the upper semiconductor chip 210.

The upper connection unit 216 and the interconnection unit 225 may be formed on the bottom surface 205b of the upper package substrate 205. The upper connection unit 216 and the interconnection unit 225 may be formed to have different heights. The upper connection unit 216 and the interconnection unit 225 may be formed not to contact each other.

The interconnection unit 225 may include the first interconnection unit 225a that is formed on the first region C corresponding to the lower semiconductor chip 110, and the second interconnection unit 225b that is formed on the second region E surrounding the first region C.

As shown in FIG. 7, as a solder joint process for integrating the upper connection unit 216 of the upper semiconductor package 200 and the lower connection unit 120 of the lower semiconductor package 100 is performed, the inter-package connection unit 250 that connects the top surface 105a of the lower package substrate 105 and the bottom surface 205b of the upper package substrate 205 may be formed.

Due to the solder joint process, the interconnection unit 225 may be adhered to the heat dissipation member 140. The heat dissipation member 140 including a plurality of metal patterns may be formed such that the metal patterns respectively correspond to a plurality of the interconnection units 225. Heat generated in the lower semiconductor chip 110 and heat generated in the lower molding material 116 that surrounds the lower semiconductor chip 110 may be transferred through the heat dissipation member 140 and the interconnection unit 225 to the upper semiconductor package 200 such that the heat is dissipated to the outside air.

Figure 19:
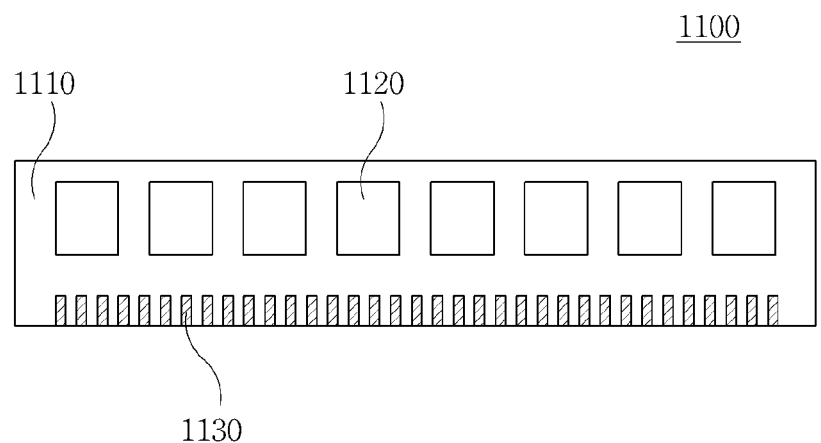
FIG. 19 is a view schematically illustrating a semiconductor module including a stack type semiconductor package, according to various embodiments.

FIG. 19 is a view schematically illustrating a semiconductor module 1100 including a stack type semiconductor package, according to various embodiments.

Referring to FIG. 19, the semiconductor module 1100 on which a package stacked structure is mounted includes a module substrate 1110, a plurality of semiconductor devices or stack type semiconductor packages 1120 that are arranged on the module substrate 1110, and module contact terminals 1130 that are formed in parallel on an edge of the module substrate 1110 and are electrically connected to the semiconductor devices or the stack type semiconductor packages 1120.

The modulate substrate 1110 may be a printed circuit board (PCB). Both surfaces of the module substrate 1110 may be used. In other words, the semiconductor devices or the stack type semiconductor packages 1120 may be arranged on both a front surface and a back surface of the module substrate 1110.

The semiconductor module 1100 may further include an additional controller or a chip set for controlling the semiconductor devices or the stack type semiconductor packages 1120.

Each of the module contact terminals 1130 may be formed of a metal, and may have oxidation resistance. The module contact terminals 1130 may be variously set according to standards of the semiconductor module 1110.

Figure 20:
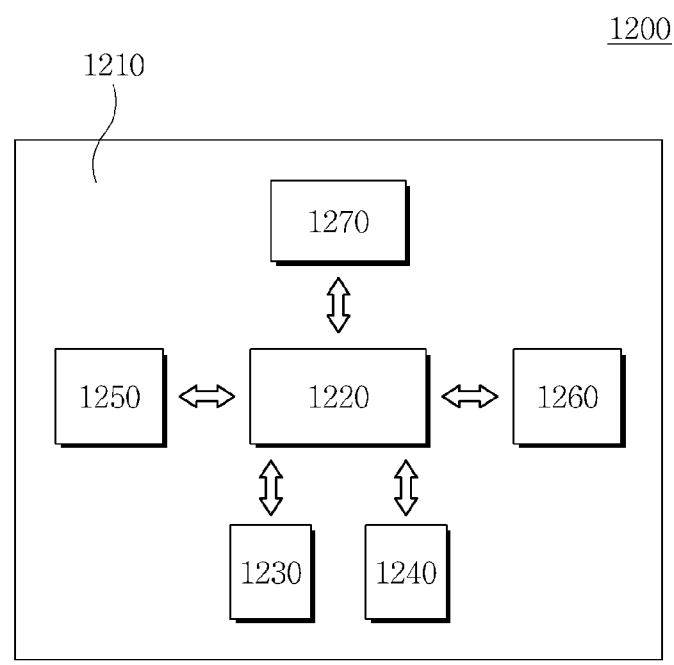
FIG. 20 is a block diagram schematically illustrating an electronic circuit board including a stack type semiconductor package, according to various embodiments.

FIG. 20 is a block diagram schematically illustrating an electronic circuit board 1200 including a stack type semiconductor package, according to various embodiments.

Referring to FIG. 20, the electronic circuit board 1200 includes a microprocessor 1220 that is disposed on a circuit board 1210, a main storage circuit 1230 and a supplementary storage circuit 1240 that communicate with the microprocessor 1220, an input signal processing circuit 1250 that transmits a command to the microprocessor 1220, an output signal processing circuit 1260 that receives the command from the microprocessor 1220, and a communication signal processing circuit 1270 that transmits/receives an electrical signal to/from other circuit boards. In FIG. 14, arrows may indicate paths through which an electrical signal may be transmitted.

The microprocessor 1220 may receive and process various electrical signals, output a result of the processing, and control other elements of the electronic circuit board 1200. The microprocessor 1220 may include a central processing unit (CPU) and/or a main control unit (MCU).

The main storage circuit 1230 may temporarily store data always or often required by the microprocessor 1220 or data before and after processing. The main storage circuit 1230 may include a semiconductor memory device because the main storage circuit 1230 needs a high speed response. In detail, the main storage circuit 1230 may be a semiconductor memory device called a cache, and examples of the main storage circuit 1230 may include a static random access memory (SRAM), a dynamic random access memory (DRAM), a resistive random access memory (RRAM), an application semiconductor memory device thereof such as a utilized RAM, a ferroelectric RAM, a fast cycle RAM, a phase-changeable RAM, or a magnetic RAM, and other semiconductor memory devices. The semiconductor device may be included in various stack type semiconductor packages. Also, the main storage circuit 1230 may include a volatile or nonvolatile RAM. In FIG. 20, the main storage circuit 1230 may include the semiconductor module 1100 including stack type semiconductor packages.

The supplementary storage circuit 1240 which is a large capacity storage device may be a nonvolatile semiconductor memory such as a flash memory or a disc drive using a magnetic field. Alternatively, the supplementary storage circuit 1240 may be a compact disc drive using light. The supplementary storage circuit 1240 may have a lower speed than the main storage circuit 1230, but may be used to store a large amount of data. The supplementary storage circuit 1240 may include the semiconductor module 1100 including stack type semiconductor packages.

The input signal processing circuit 1250 may convert an external command into an electrical signal, or may transmit an external electrical signal to the microprocessor 1220. The external command or the external electrical signal may be an operation command, an electrical signal to be processed, or data to be stored. Examples of the input signal processing circuit 1250 may include a terminal signal processing circuit that processes an on-signal transmitted from a keyboard, a mouse, a touchpad, an image recognition apparatus, or various sensors, an image signal processing circuit that processes an image signal input from a scanner or a camera, various sensors, and an input signal interface. The input signal processing circuit 1250 may include the semiconductor module 1100 including stack type semiconductor packages.

The output signal processing circuit 1260 may be an element for transmitting an electrical signal processed by the microprocessor 1220 to the outside. Examples of the output signal processing circuit 1260 may include a graphics card, an image processor, an optical converter, a beam panel card, and an interface circuit having various functions. The output signal processing circuit 1260 may include the semiconductor module 1100 including stack type semiconductor packages.

The communication circuit 1270 is an element for directly transmitting/receiving an electrical signal to/from another electronic system or another circuit board without the input signal processing circuit 1250 or the output signal processing circuit 1260. Examples of the communication circuit 1270 may include a modem of a personal computer system, a local area network (LAN) card, and various interface circuits. The communication circuit 1270 may include the semiconductor module 1100 including stack type semiconductor packages.

Figure 21:
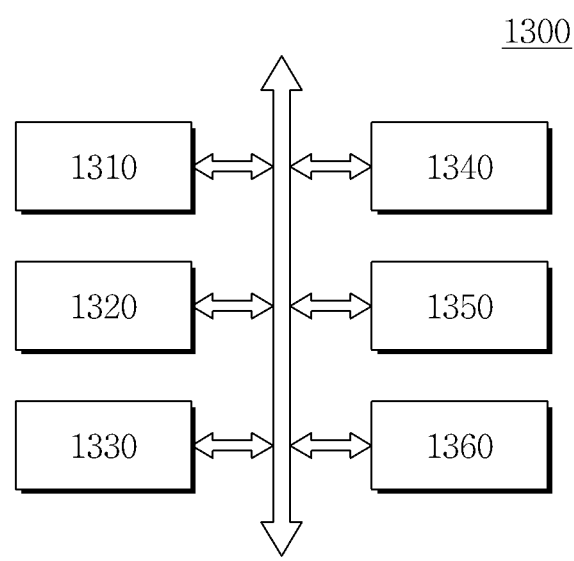
FIG. 21 is a block diagram schematically illustrating an electronic system including a semiconductor module including a stack type semiconductor package, according to various embodiments.

FIG. 21 is a block diagram schematically illustrating an electronic system 1300 including the semiconductor module 1100 including a stack type semiconductor package, according to various embodiments.

Referring to FIG. 21, the electronic system 1300 may include a control unit 1310, an input unit 1320, an output unit 1330, and a storage unit 1340, and may further include a communication unit 1350 and/or an operation unit 1360.

The control unit 1310 may control overall operations of elements of the electronic system 1300. The control unit 1310 may be a CPU or a central control unit, and may include the electronic circuit board 1200 of FIG. 20. Also, the control unit 1310 may include the semiconductor module 1100 including stack type semiconductor packages.

The input unit 1320 may transmit an electrical command signal to the control unit 1310. Examples of the input unit 1320 may include a keyboard, a keypad, a mouse, a touchpad, an image recognizer such as a scanner, and various input sensors. The input unit 1320 may include the semiconductor module 1100 including stack type semiconductor packages.

The output unit 1330 may receive an electrical command signal from the control unit 1310 and may output a processing result of the electronic system 1300. Examples of the output unit 1330 may include a monitor, a printer, a beam irradiator, and various mechanical apparatuses. The output unit 1330 may include the semiconductor module 1100 including stack type semiconductor packages.

The storage unit 1340 may be an element for temporarily or permanently storing an electrical signal processed or to be processed by the control unit 1310. The storage unit 1340 may be physically or electrically connected or coupled to the control unit 1310. Examples of the storage unit 1340 may include a magnetic storage device such as a semiconductor memory or a hard disc, an optical storage device such as a compact disc, and other servers each having a storage function. Also, the storage unit 1340 may include the semiconductor module 1100 including stack type semiconductor packages.

The communication unit 1350 may receive an electrical command signal from the control unit 1310 and may transmit/receive an electrical signal to/from another electronic system. The communication unit 1350 may be a wired transmitter/receiver such as a modem or a LAN card, a wireless transmitter/receiver such as a WiBro interface, or an infrared port. Also, the communication unit 1350 may include the semiconductor module 1100 including stack type semiconductor packages.

The operation unit 1360 may perform a physical or mechanical operation according to a command of the control unit 1310. For example, the operation unit 1360 may be an element that performs a mechanical operation such as a plotter, an indicator, or an up/down operator. Examples of the electronic system 1300 may include a computer, a network server, a networking printer or scanner, a wireless controller, a mobile communication terminal, a switching device, and other electronic products that each perform a programmed operation.

According to the various embodiments, since a lower semiconductor chip and an upper package substrate are connected by means of an interconnection unit with a heat dissipation member therebetween, heat generated in the lower semiconductor chip may be smoothly transferred through the heat dissipation member and the interconnection unit to an upper semiconductor package. Accordingly, heat dissipation efficiency of a stack type semiconductor package may be improved and an operation error caused by overheating may be avoided. Thus, product reliability and durability may be improved.

While the exemplary embodiments have been particularly shown and described, they are provided for the purposes of illustration and it will be understood by those of ordinary skill in the art that various modifications and equivalent other embodiments can be made. Accordingly, the true technical scope of the exemplary embodiments are defined by the technical spirit of the appended claims.

What is claimed is:

1. A stack type semiconductor package comprising:
   a lower semiconductor package comprising a lower package substrate, and a lower semiconductor chip which is mounted on the lower package substrate and comprises a first surface facing a top surface of the lower package substrate and a second surface opposite to the first surface;
   an upper semiconductor package comprising an upper package substrate and an upper semiconductor chip which is mounted on the upper package substrate;
   an inter-package connection unit which connects the lower package substrate and the upper package substrate;
   a heat dissipation member which is formed on the second surface of the lower semiconductor chip;
   an interconnection unit which is formed on a bottom surface of the upper package substrate, and is adhered to the heat dissipation member to connect the lower semiconductor chip and the upper package substrate;
   a plurality of first upper lands which are formed on a top surface of the upper package substrate to be insulated from one another by a first solder resist layer, and which the upper semiconductor chip is connected;
   a plurality of second upper lands and a plurality of third upper lands which are formed on the bottom surface of the upper package substrate, the second upper lands are insulated from the third upper lands by a second solder resist layer, and which the inter-package connection unit and the interconnection unit are respectively connected,
   wherein a maximum height of the inter-package connection unit measured in a first direction is substantially greater than a maximum height of the interconnection unit measured in the first direction, wherein the first direction is perpendicular to the top surface of the lower package substrate, and
   wherein the third upper lands are not electrically connected to the first upper lands and the second upper lands, and the second upper lands and the third upper lands have different exposure sizes.

2. The stack type semiconductor package of claim 1, wherein the interconnection unit comprises a solder ball.

3. The stack type semiconductor package of claim 1, wherein the interconnection unit is formed on a portion of the bottom surface of the upper package substrate corresponding to the lower semiconductor chip.

4. The stack type semiconductor package of claim 1, wherein the heat dissipation member comprises a metal layer fully plated on the second surface of the lower semiconductor chip.

5. The stack type semiconductor package of claim 1, wherein the interconnection unit comprises a plurality of solder balls, and
   the heat dissipation member comprises a plurality of metal patterns which are formed using an inkjet printing method,
   wherein the plurality of metal patterns are formed to respectively correspond to the plurality of solder balls.

6. The stack type semiconductor package of claim 1, further comprising a lower molding material which is formed on the lower package substrate and surrounds a side surface of the lower semiconductor chip.

7. The stack type semiconductor package of claim 6, wherein the heat dissipation member is formed to extend toward a portion of a top surface of the lower molding material so as to not contact the inter-package connection unit.

8. The stack type semiconductor package of claim 7, wherein the interconnection unit comprises a first interconnection unit which corresponds to a portion of the heat dissipation member formed on the lower semiconductor chip, and a second interconnection unit which corresponds to a portion of the heat dissipation member formed to extend to the portion of the top surface of the lower molding material.

9. The stack type semiconductor package of claim 1, wherein the inter-package connection unit comprises a lower connection unit which is formed on the lower package substrate and an upper connection unit which is formed on the second upper lands of the upper package substrate,
   wherein the upper connection unit and the interconnection unit have different heights.

* * * * *